(12) United States Patent
Imajo et al.

(10) Patent No.: US 8,373,636 B2
(45) Date of Patent: Feb. 12, 2013

(54) DRIVING METHOD FOR DISPLAY DEVICE

(75) Inventors: Yoshihiro Imajo, Mobara (JP); Tetsuro Izawa, Mobara (JP); Kimitoshi Ohgiichi, Mobara (JP); Hiroshi Okawara, Mobara (JP); Shiro Ueda, Chiba (JP); Nobuyuki Ishige, Shirako (JP); Tetsuya Kawamura, Mobara (JP); Hisashi Ishino, Ohamishirasato (JP); Fumiaki Komori, Ohhara (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days.

(21) Appl. No.: 13/596,659

(22) Filed: Aug. 28, 2012

(65) Prior Publication Data

US 2013/0002734 A1   Jan. 3, 2013

Related U.S. Application Data

(63) Continuation of application No. 13/444,122, filed on Apr. 11, 2012, now Pat. No. 8,279,154, which is a continuation of application No. 12/078,522, filed on Apr. 1, 2008, now Pat. No. 8,179,353, which is a continuation of application No. 11/283,766, filed on Nov. 22, 2005, now Pat. No. 7,453,428, which is a continuation of application No. 10/747,450, filed on Dec. 30, 2003, now Pat. No. 6,842,164, which is a continuation of application No. 09/791,172, filed on Feb. 13, 2001, now Pat. No. 6,697,040.

(30) Foreign Application Priority Data

Feb. 18, 2000   (JP) .................................. 2000-040992
May 15, 2000   (JP) .................................. 2000-141263

(51) Int. Cl.
*G09G 3/36*   (2006.01)
*G09G 5/00*   (2006.01)
*G06F 3/038*   (2006.01)

(52) U.S. Cl. .......................................... 345/99; 345/206
(58) Field of Classification Search .................... 345/98, 345/99, 100, 206
See application file for complete search history.

(56) References Cited

U.S. PATENT DOCUMENTS

| | | | |
|---|---|---|---|
| 5,274,483 A | 12/1993 | Itoh | |
| 5,283,565 A | 2/1994 | Suzuki et al. | |
| 5,592,199 A | 1/1997 | Kawaguchi et al. | |
| 5,739,887 A | 4/1998 | Ueda et al. | |
| 5,994,766 A | 11/1999 | Shenoy et al. | |
| 6,037,654 A | 3/2000 | Tamura | |
| 6,169,593 B1 | 1/2001 | Kanaya et al. | |
| 6,211,849 B1 | 4/2001 | Sasaki et al. | |
| 6,292,248 B1 | 9/2001 | Lee et al. | |
| 6,342,727 B1 | 1/2002 | Fujimori | |
| 6,456,271 B1 | 9/2002 | Tamai et al. | |
| 6,525,718 B1 | 2/2003 | Murakami et al. | |
| 6,697,040 B2 | 2/2004 | Imajo et al. | |

FOREIGN PATENT DOCUMENTS

| | | |
|---|---|---|
| JP | 3-029923 | 2/1991 |
| JP | 4-028624 | 1/1992 |
| JP | 4-28624 U | 3/1992 |
| JP | 10-153760 | 6/1998 |
| JP | 10-198285 | 7/1998 |
| JP | 11-194748 | 7/1999 |
| KR | 1999-009397 | 2/1999 |

OTHER PUBLICATIONS

Office Action issued from the Japanese Patent Office, in corresponding Japanese Patent Application No. 2010-247427, mailed Aug. 14, 2012, and 1 page in its English translation.

*Primary Examiner* — Kevin M Nguyen
(74) *Attorney, Agent, or Firm* — Stites & Harbison, PLLC; Juan Carlos A. Marquez, Esq

(57) ABSTRACT

A liquid crystal display includes pixels each having an switching element, drain drivers and gate drivers for operating the switching elements and the pixels, and drain lines and gate lines supplying signals from the drain drivers and the gate drivers to the switching elements being formed on one of a pair of substrates sandwiching a liquid crystal layer. Wiring lines are formed on the one of a pair of substrates for transferring display data signals and a clock signal to the gate drivers.

4 Claims, 31 Drawing Sheets

FIG. 11A
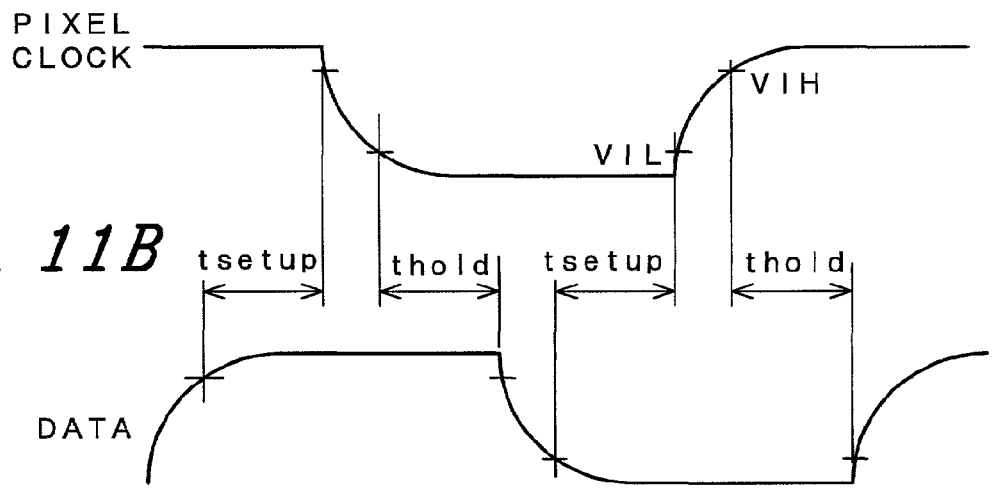
FIG. 11B
FIG. 12
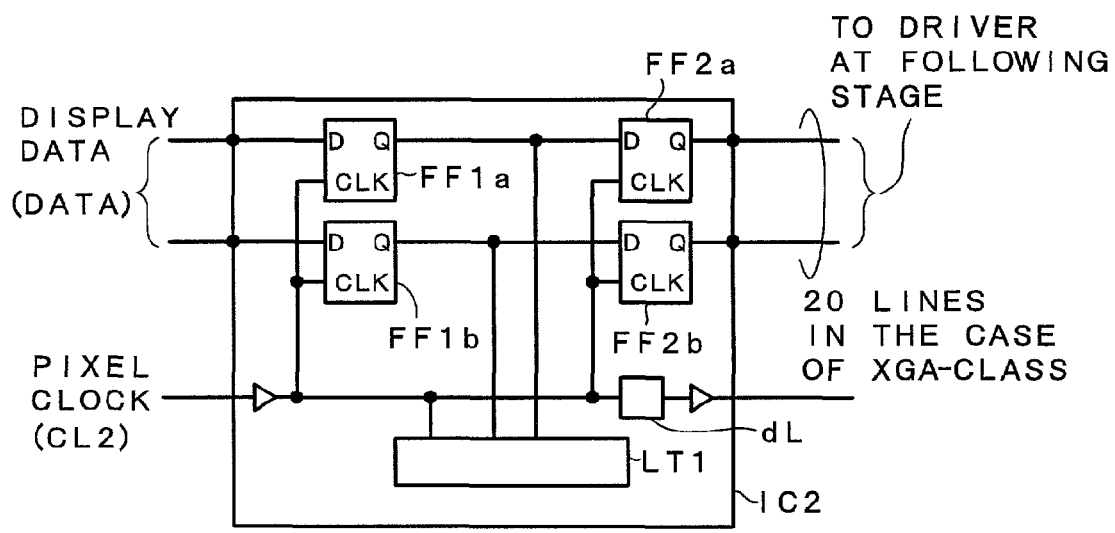

FIG. 13A
PIXEL
CLOCK
FIG. 13B
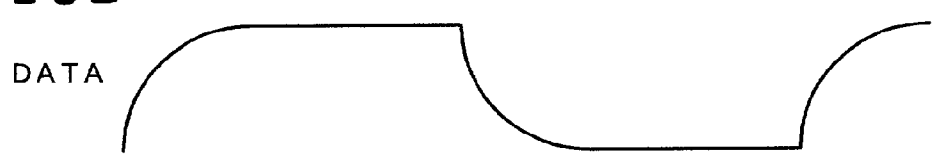
DATA
FIG. 14A
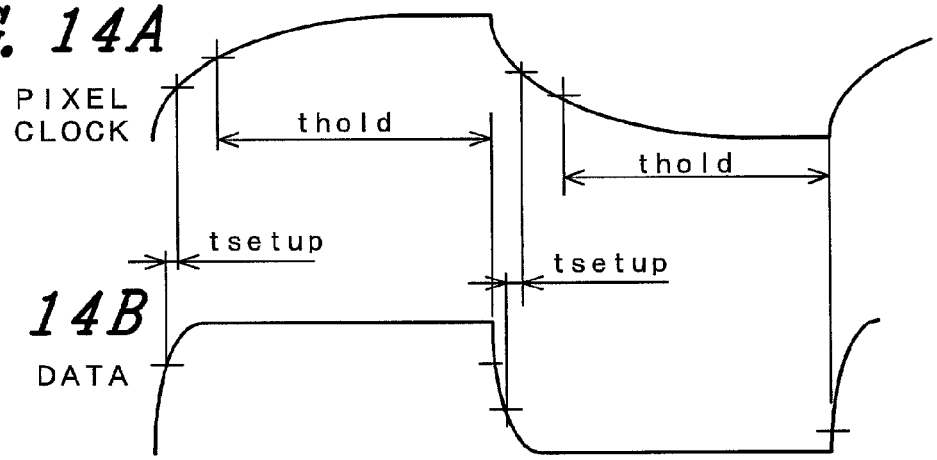
PIXEL
CLOCK
thold   thold
tsetup  tsetup
FIG. 14B
DATA

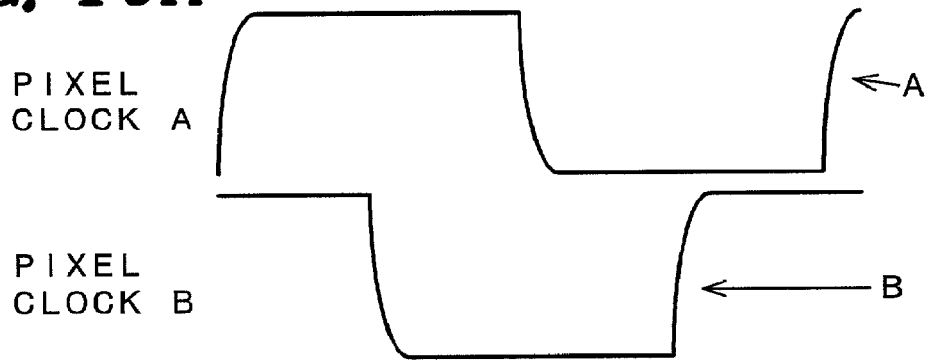
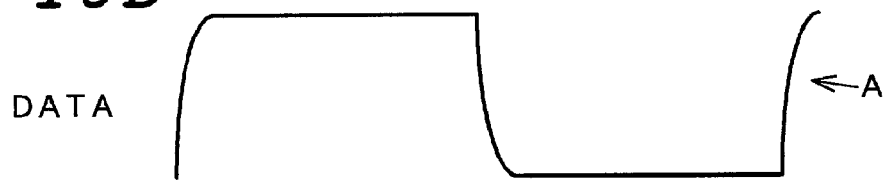
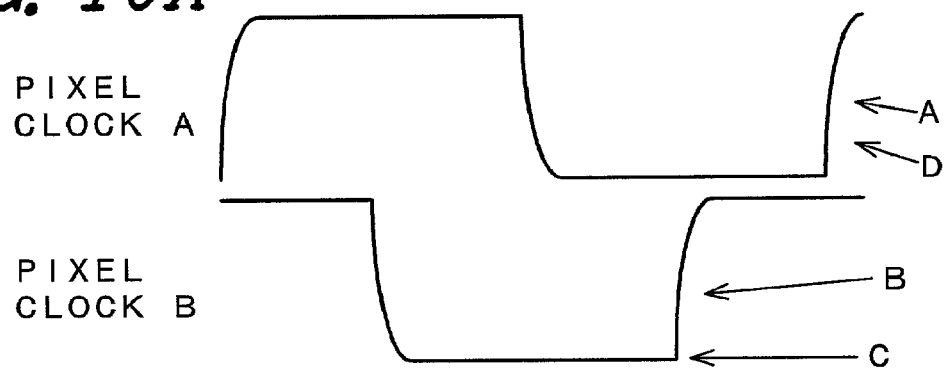
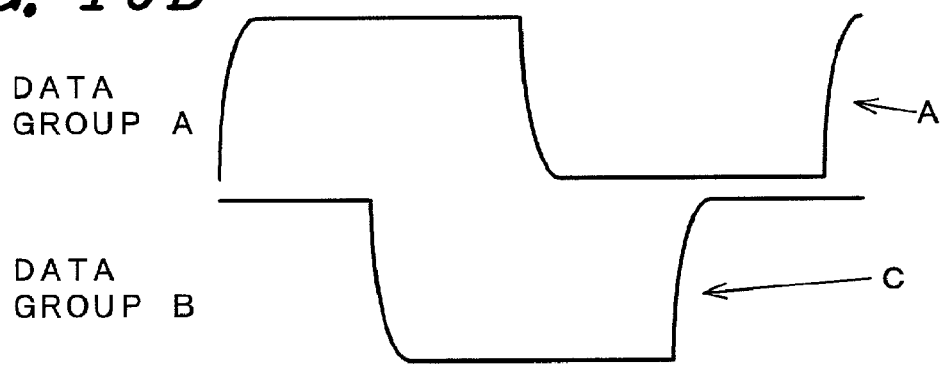

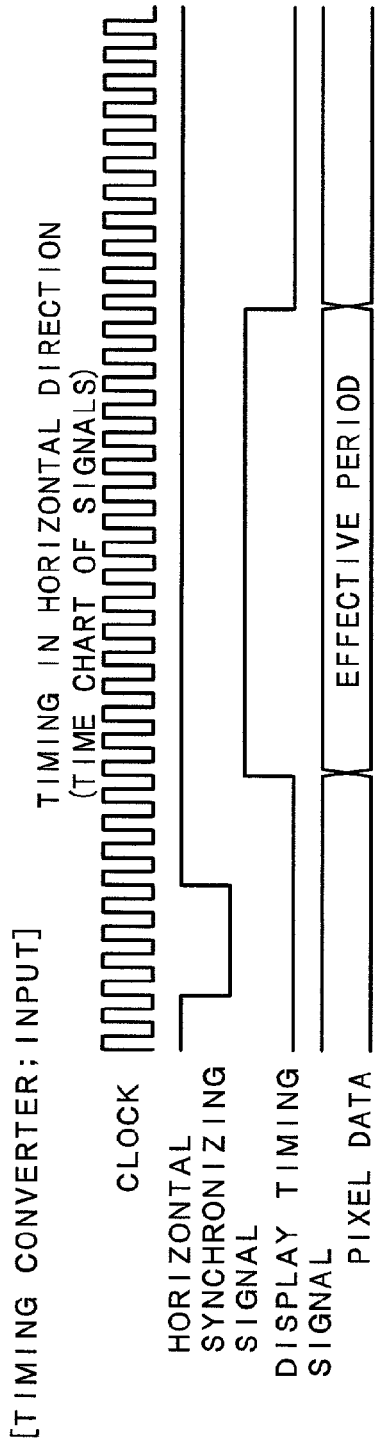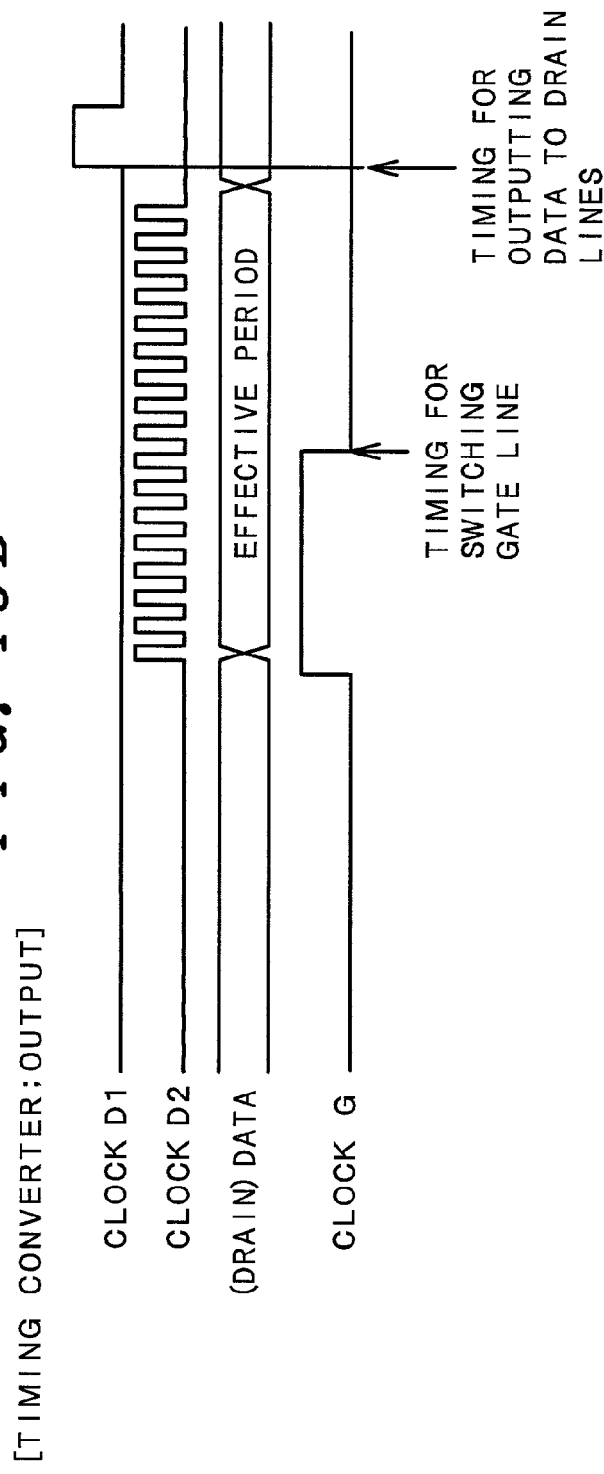

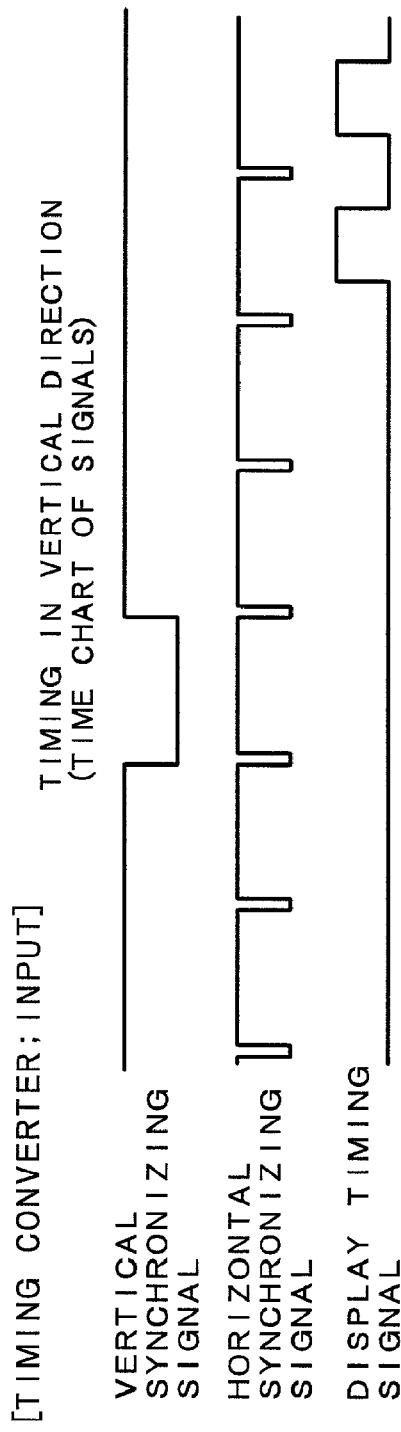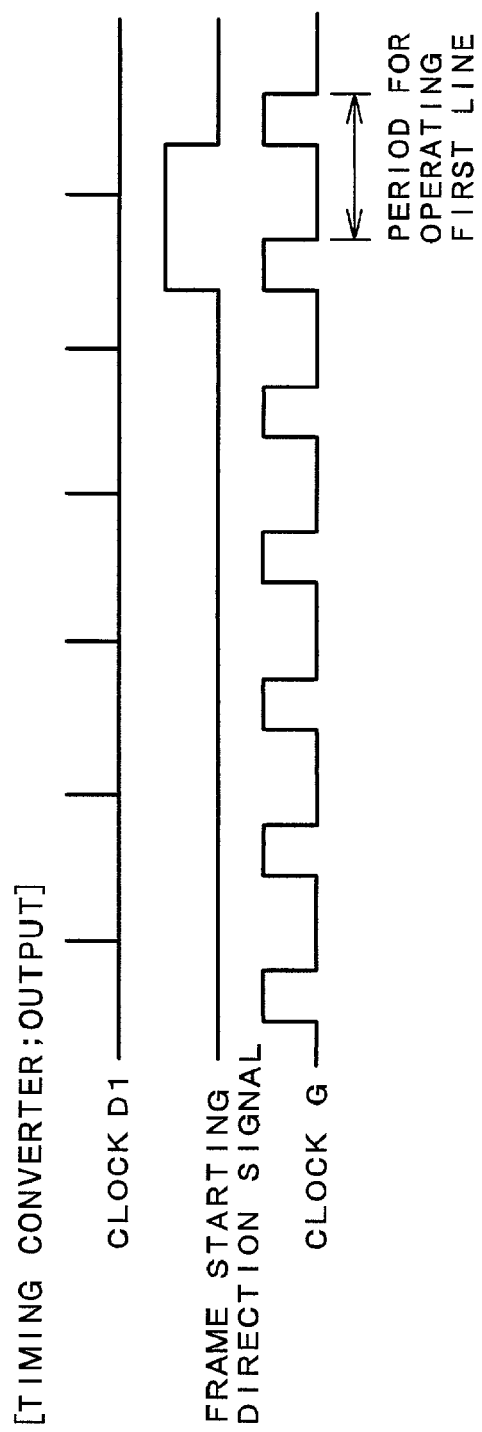

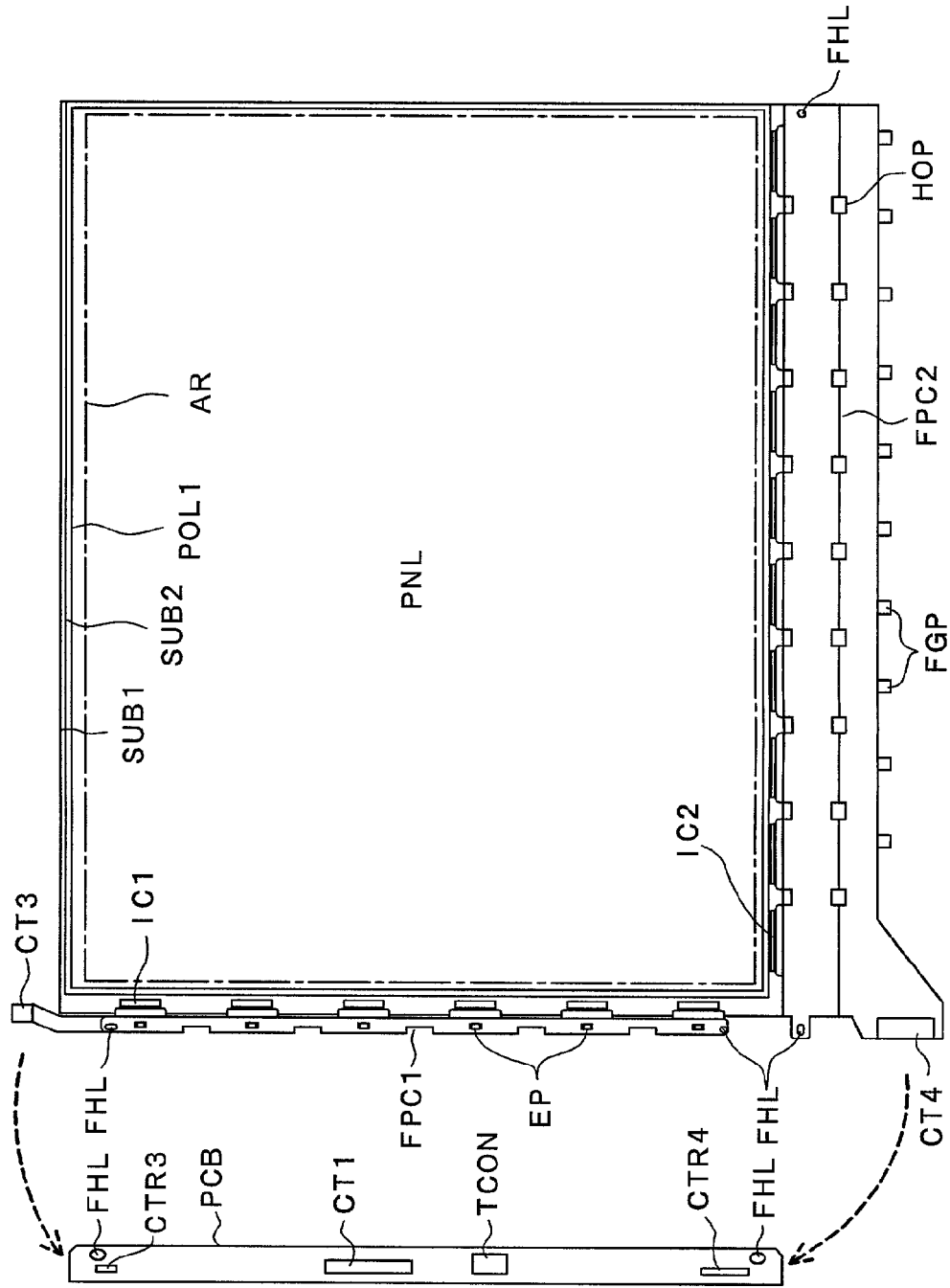

DRIVING METHOD FOR DISPLAY DEVICE

CROSS-REFERENCE TO RELATED APPLICATIONS

This application is a Continuation application of U.S. application Ser. No. 13/444,122 filed Apr. 11, 2012, which is a Continuation application of U.S. application Ser. No. 12/078,522 filed Apr. 1, 2008, which is a Continuation application of U.S. application Ser. No. 11/283,766 filed Nov. 22, 2005, which is a Continuation application of U.S. application Ser. No. 10/747,450 filed Dec. 30, 2003, which is a Continuation application of U.S. application Ser. No. 09/791,172 filed Feb. 13, 2001. Priority is claimed based on U.S. application Ser. No. 13/444,122 filed Apr. 11, 2012, which claims priority to U.S. application Ser. No. 12/078,522 filed Apr. 1, 2008, which claims priority to U.S. application Ser. No. 11/283,766 filed Nov. 22, 2005, which claims priority to U.S. application Ser. No. 10/747,450 filed Dec. 30, 2003, which claims priority to U.S. application Ser. No. 09/791,172 filed Feb. 13, 2001, which claims priority to Japanese Patent Application No. 2000-040992 filed on Feb. 18, 2000, and Japanese Patent Application No. 2000-141263 filed on May 15, 2000, all of which is incorporated by reference.

BACKGROUND OF THE INVENTION

1. Field of the Invention

This invention relates to a liquid crystal display device. More particularly, this invention relates to a liquid crystal display device that simplifies a wiring structure of a flexible printed substrate for supplying driving signals to a driver IC mounted by a flip chip mounting system and reduces a cost by employing a novel signal transmission system.

2. Description of the Related Art

Liquid crystal display devices have been wide spread as a display device for various image displaying apparatuses. An active matrix type liquid crystal display device, that has an active cell such as a thin film transistor TFT for each pixel and switches and drives the active cell, applies a liquid crystal driving voltage (gray scale voltage) to a pixel electrode through the active cell. Therefore, this liquid crystal display device is free from cross-talk between the pixels and can conduct multiple gray scale display without employing a specific driving method for preventing cross-talk that has been necessary in a simple matrix type liquid crystal display device.

FIG. 42 of the accompanying drawings is a block diagram useful for explaining a structural example of a driving circuit in an active matrix type liquid crystal display device.

FIGS. 43A, 43B, 44A and 44B are explanatory views (signal time charts) for explaining horizontal direction timing and vertical direction timing of display control in FIG. 42.

As shown in FIG. 42, the liquid crystal display device includes an interface substrate (a rigid printed substrate) having mounted thereto an interface circuit that receives display data (which will be called also "pixel data") and a control signal from a host computer, and applies pixel data, various clock signals and various driving voltages to a liquid crystal panel TFT-LCD.

The interface circuit has a display control device equipped with a timing converter TCON and a power supply circuit. The display control device outputs timing signals such as a data bus for transmitting image data, a data bus for transferring a second pixel, a clock D2 (CL2) required for a drain driver to acquire pixel data (which will be called merely "data", too), a clock D1 (CL1) required for the drain driver to switch a liquid crystal driving signal, a frame starting direction signal for driving a gate driver and a gate clock (clock G), to the liquid crystal panel.

The power supply circuit includes a positive gray scale voltage generating circuit, a negative gray scale voltage generating circuit, a voltage generating circuit for counter electrodes and a voltage generating circuit for gate electrodes.

The number of display pixels of the liquid crystal panel constituting the liquid crystal display device shown in FIG. 42 is (1,024.times.3 in a lateral direction).times. (768 in a longitudinal direction). A liquid crystal panel having higher resolution is known, too. The interface substrate for receiving the display data and the control signals from the host computer receives data in pixel unit, that is, data of each of red (R), green (G) and blue (b) as a set, and transfers (or transmits) one pixel data set in a unit time to the drain driver through data lines shown in FIG. 38.

The host computer transmits a clock signal as the reference of the unit time to the liquid crystal display device. More concretely, the liquid crystal display device having 1,024.times.768 pixels of this structural example uses ordinarily a frequency of 65 MHz.

The liquid crystal panel TFT-LCD has a construction such that the drain drivers (called also "TFT drivers") are situated in the lateral direction with the display screen as the reference. The drain drivers are connected to the drain lines of the thin film transistors TFT to supply a voltage for driving the liquid crystal. The gate drivers are connected to the gate lines, and a voltage is supplied to the gates of the thin film transistors TFT for a certain predetermined time (one horizontal operation time).

A timing converter comprises a semiconductor integrated circuit (LSI), receives the display data and the control signals from the host computer and outputs necessary display data and operation clocks to the gate drivers on the basis of them. Incidentally, the data line for one pixel has 18 bits (six bits for each of R, G and B).

The host computer transmits signals to the timing converter of the liquid crystal display device by low voltage amplification differential signals, or so-called "LVDS". The timing converter transmits the signals at a CMOS level to the drain drivers. However, it is difficult in this case to supply 65 MHz pixel clocks. Therefore, the display date is transmitted in synchronism with both edges of the rise and fall of a 32.5 MHz clock.

As shown in FIGS. 43A, 43B, 44A and 44B, pulses of one horizontal time cycle are given to the gate drivers on the basis of the horizontal synchronizing (sync) signal and the display timing signal so as to supply voltages to the gate lines of the thin film transistors TFT in each horizontal time. The frame starting direction signal is given, too, on the basis of the vertical sync signal so that display can be made from the first line in one frame time unit.

The positive gray scale voltage generating circuit and the negative gray scale voltage generating circuit of the power supply circuit generate a reference voltage for converting a voltage, that is to be given to the liquid crystal in every certain time, to an alternating current. This alteration is conducted in practice as the positive gray scale voltage and the negative gray scale voltage are alternately switched and used inside the drain driver. Incidentally, the term "alteration" used hereby means alternation of the voltage to be given to the drain driver to the positive voltage side/negative voltage side in every predetermined time. Here, the cycle of this alteration corresponds to one frame time unit.

The flip chip system described above is also called an "FCA system". This FCA system is the one that directly mounts the driving IC (drain drivers and gate drivers) to the outer periphery of one of the substrates of the liquid crystal panel (generally, the lower substrate), and is also called a "chip-on-glass system (COG)". Various signals and an operation power source to the driving IC (drain drivers and gate drivers) directly mounted to the substrate of the liquid crystal panel are supplied through the flexible printed substrate FPC connected to the interface substrate.

FIG. 45 is an explanatory of a mounting example of a drain driver and a gate driver of a liquid crystal display device and an interface substrate. A drain line side flexible printed substrate FPC2 is fitted to one of the edges (to the lower edge in the drawing, a side in a major direction) of a liquid crystal panel PNL formed by bonding a lower substrate SUB1 and an upper substrate SUB2, and is folded to the back of the liquid crystal panel PNL along the arrangement of an open portion HOP.

A gate line side flexible printed substrate FPC1 is fitted to the left edge (the left edge in the drawing, or a side in a minor direction), and its connector CT3, a connector CTR3 of the interface substrate PCB and a connector CTR4 connected to a connector CT4 of the drain line side flexible printed substrate FPC2 are coupled with one another. An interface connector CT1 for connecting signals from the host computer, a timing converter TCON, and so forth, are further fitted to this substrate FPC1. Incidentally, this example employs the data transfer system of an LVDS system. A reception side signal converter (LVDS-R) necessary in this case is integrated with the same chip as that of the timing converter TCON to reduce the mounting area on the interface substrate.

An upper polarizer POL1 is bonded to the surface side of the liquid crystal panel PNL (to the surface of the upper substrate SUB2) and a display area AR is formed inside the upper polarizer POL1.

The chip IC2 mounted to the outer edge of the lower side of the lower substrate is the drain driver and the chip IC1 mounted to the outer edge of the left side is the gate driver. Symbol FGP represents a frame ground pad and FHL does a positioning hole.

SUMMARY OF THE INVENTION

In the conventional liquid crystal display device of this IPS system, the display control device equipped with the timing converter TCON supplies in parallel the date for display, the gray scale voltage (analog signals) and the pixel clocks to each drain driver. It is necessary to pass a large number of lines through the drain line side flexible printed substrate FPC2 (drain FPC) for supplying various clock signals (timing signals) inclusive of the data, the gray scale voltage and the pixel clock signal to the drain driver. Therefore, it is necessary to use either a multi-layered FPC having a narrow (thin) width or an FPC a of dual-sided wiring type having a wide (thick) width. In either case, the cost is extremely high.

Japanese Patent Laid-Open Publication No. 6-13724 proposes a construction that supplies the data and the pixel clocks to the driving IC without using the FPC. According to this reference, the drain drivers are mounted by the FCA system, and are connected in series with one another through a pass line formed by transferring a patterned metal film onto the substrate of the liquid crystal panel (serial series supply system, or so-called "bucket relay system"). The term "bucket relay system" is used because the signal transform for serially transferring the signals through a plurality of driving ICs is analogous to the transfer form when a plurality of people hand over and transfer serially the buckets carrying water.

Such a bucket relay system for supplying the data, the gray scale voltage and various clock signals inclusive of the pixel clock can obtain desired effects in a so-called "simple matrix type liquid crystal display device" that has a relatively small number of lines.

In contrast, in the thin film transistor type liquid crystal display device, a large number of signals and voltages such as the data, the gray scale voltage, the timing signals inclusive of the pixel clock, the power supply, and so forth, must be supplied to the drain drivers. To pattern all these signals and voltages to the side edge of the liquid crystal panel, the periphery of the panel must have a large area, and so-called "narrowing of frame" becomes extremely difficult. This problem becomes all the more remarkable when resolution (fineness) of the liquid crystal device becomes higher.

When a plurality of drain drivers are connected in series (the bucket relay system described above), the delay amount varies depending on the difference of the wiring resistance of each of the signal lines and voltage lines and the timing margin cannot be satisfied with the result that the drain drivers fail to normally acquire the data and invite abnormal display. This is one of the problems to be solved.

The frequency of the pixel clock necessary for the drain drivers to acquire the data becomes higher as fineness of display becomes higher and electromagnetic interference (EMI) to outside is more likely to occur.

The problem resulting from high fineness similarly occurs on the gate driver side.

It is an object of the present invention to provide a liquid crystal display device that solves the problems of the prior art technologies described above and can display high-quality images at a low cost.

This and other objects and novel features of the present invention will become more apparent from the following detail description of the invention in connection with the accompanying drawings.

To accomplish these objects, the present invention is characterized in that power supply lines among lines for data signals (image or display data, timing signals for pixel clocks and gray scale voltage) are wired mainly on a flexible printed substrate FPC, and other signals and all or almost all the voltages are transferred through lines directly formed on a substrate of a liquid crystal panel.

As disclosed in Japanese Patent Laid-Open Publication No. 6-13724 described above, the wiring resistance on the substrate of the liquid crystal panel remains high when a plurality of driving ICs are merely connected by the bucket relay system in the thin film transistor TFT system, and the device sometimes fails to operate normally.

To solve such problems of the prior art, a liquid crystal display device according to the present invention includes a liquid crystal panel having pixels each being arranged at an intersection between each of a plurality of drain lines and each of a plurality of gate lines intersecting the drain lines, a plurality of drain drivers arranged in an extending direction of the gate lines, for applying gray scale voltage signals to the pixels so arranged as to correspond to predetermined groups of a plurality of drain lines on the basis of display data signals, a plurality of gate drivers arranged in an extending direction of the drain lines, for applying scanning voltage signals to the pixels arranged along the drain lines, a timing converter for generating the display data signals and various high-speed and low-speed clock signals inclusive of pixel clocks on the basis of a display signal and a timing signal inputted from outside, lines for serially transferring in series the display data signal, the gray scale voltage signal and the various high-speed and low-speed clock signals inclusive of the pixel clock to at least the drain driver mounted directly to one of the substrates of the liquid crystal panel and between the drain drivers, and gate circuits controlled by the pixel clock signals, and disposed for each of the drain drivers on either one, of both, of the input side and the output side of the display data and said gray scale voltage to the drain drivers.

This construction can avoid degradation of image quality that would otherwise occur as the delay amount varies depending on the wiring resistance of each of the signal line and the voltage line, the timing margin cannot be satisfied and the drain drivers cannot normally acquire the data.

The present invention employs the following constructions as means for solving the problems of the prior art technologies.

(1) Gate circuits are disposed on the output side of the display data signals of the drain driver and on the output side of the pixel clock signals. The gate circuit inhibits the transfer of the display data signal and the pixel clock signal to the display data line and to the pixel clock line of a following stage while the drain driver itself acquires the display data signal, and starts transferring the display data and the pixel clock signal to the following stage when the drain driver finishes acquiring the display data signal.

The gate circuit described above can appropriately use a flip-flop circuit, but can also use other means having similar functions.

(2) A timing converter is mounted to one of the substrates of the liquid crystal panel. The substrate to which the timing converter is mounted is suitably a so-called "thin film transistor substrate".

This construction can shorten the wiring length from the timing converter to the drain driver and the gate driver, and can simplify the construction on the side of the flexible printed substrate for supplying the signals and power when the lines for the timing converter, the drain driver and the gate driver are directly formed on the substrate.

(3) A buffer amplifier for driving a gray scale voltage dividing circuit inside the drain driver is disposed at the gray scale voltage input of the drain driver.

(4) The line width of the lines for the display data signal and the pixel clock signal as the high-speed digital signals, the line width of the lock signals as the low-speed digital signal other than the pixel clock signal and the line width of the line for the gray scale voltage as the low-speed analog signal are changed in accordance with their allowable resistance values.

(5) The wiring resistance of the line for the display data signal is set to an equal value of the wiring resistance of the line for the pixel clock signal, and the size of the terminal to be formed on the line, for connecting the drain driver is different between the high-speed digital signal line and the low-speed analog line.

The resistance values of the lines can be set to desired values in accordance with the kind of the signals, and the signal delay in the serial series transfer system can be avoided.

(6) The drain driver connection terminals for the high-speed digital signals are arranged zigzag on the minor side of the drain driver, and this arrangement of the connection terminals on one of the minor sides of the drain driver is moved as such in parallel to the other minor side so as to align the wiring resistance on both sides.

(7) The drain driver connection terminals for the low-speed digital signals and for the analog signals are arranged on the major side of the drain driver.

(8) The output terminals of the drain driver are arranged on the major side on the outer edge side of the substrate of the drain driver, and are connected to common lines formed outside a substrate cutting line from the output terminals.

(9) The drain driver power supply terminals are arranged in two rows to reduce the contact resistance.

(10) Bumps to be connected to the lines of the drain driver of a preceding stage arranged inside the substrate of the drain driver and the bumps to be connected to the lines of the drain driver of a following stage are formed in two rows in a direction parallel to the minor sides of the drain driver so that they can be used in common for two kinds of drain drivers having mutually different size specifications in the direction parallel to the minor sides of the drain drivers.

(11) The terminals of the power supply FPC of the drain driver to be connected to the lines of the flexible printed substrate are serially disposed zigzag along the outer edge of the substrate on the side of the substrate cutting line.

(12) The liquid crystal display device includes a flexible printed substrate having power supply lines and grounding lines formed thereon for supplying power to the drain drivers, and this flexible printed substrate is disposed on only the drain driver mounting surface of one of the substrates of the liquid crystal panel with the exception of the portion at which the flexible printed substrate is connected to an external printed substrate.

(13) The flexible printed substrate has a protruding portion that protrudes into the arrangement gap between the drain drivers, and an electronic component is mounted to this protruding portion.

(14) The edge of the FPC is allowed to slightly protrude from the edge of one of the substrates of the liquid crystal panel. According to this arrangement, it is possible to prevent the liquid crystal panel from directly striking a cassette or a tray during the production process and from being damaged, or to prevent static electricity from entering the drain lines.

In the construction according to the prior art, the various signals and power that are necessary for display such as the data signals (data, gray scale voltage, clock signals) are supplied to the drain drivers (inclusive of the gate drivers; hereinafter called merely the "drivers", too) mounted to one of the substrates of the liquid crystal panel through the flexible printed substrate. In contrast, in the construction according to the present invention, the lines for supplying the data signals (data, clock signals, gray scale voltage) other than power among the various signals and power described above are directly formed on one of the substrates of the liquid crystal panel, and the flexible printed substrate FPC is mainly used for supplying power as can be clearly understood from the construction described above.

The lines of the data signals and the power supply lines on the gate driver side are directly formed on the lower substrate. Therefore, the flexible printed substrate can be used for only supplying power on the drain driver side. It is thus possible to reduce the number of components and to facilitate the assembly work.

To supply the data signals and power to the gate driver side, a small flexible printed substrate sheet for only the connection with the flexible printed substrate on the drain driver side or with the interface substrate is fitted to the drain driver side or, if necessary, to the gate driver side. In this way, the size of the flexible printed substrate on the gate driver side can be substantially reduced.

The lines on the substrate of the liquid crystal panel are so arranged as to connect the drivers adjacent to one another, and the clocks, the data and the gray scale voltages are transferred in each driver to the drivers of the following stages by the bucket relay system.

If this connection is made merely through the drivers, the resistances of the lines formed on the substrate are so high that the liquid crystal display device fails to operate normally. In each of the constructions described above, therefore, the present invention drives the liquid crystal display device in the ways listed below.

1) A buffer is disposed inside the driver for the digital signals such as clock and data signals, and each signal is sent to the following stage after it is buffered.

2) The signal waveforms to the drivers of the following stage are selected so that the time constant $\tau$ of the signal line satisfies substantially the equation $\tau = (t_{cycle} - t_{set} - t_{hold})/2$ to make the waveform appropriately dull. Symbols $t_{cycle}$, $t_{setup}$ and $t_{hold}$ will be explained later.

3) If the buffers are merely disposed, the variance of the delay time inside the driver accumulates before each signal reaches the rearmost drain driver, in particular, among the drivers that are connected by the bucket system or in a row with the result that a sufficient timing margin cannot be secured in some cases. Therefore, a flip-flop acquires the data for each driver, and the data is sent to the driver of the following stage after timing is aligned.

4) To lower the operation frequency of the clock, the present invention employs a so-called "dual edge operation" that acquires the data in synchronism with both rise and fall edges of the clock.

5) In the case of the dual edge operation, the change timing of the data when the data is outputted to the driver of the following stage must be generated inside the driver. Therefore, this change timing is generated as the delay is generated in the clock inside the driver, the setup/hold time necessary for the next driver to acquire the data is secured.

6) Another method for securing the setup/hold time of the driver of the following stage is to change the resistance of the lines between the drivers by means of the clock and the data. When the wiring resistance of the clock is increased to make the waveform greatly dull, the wiring delay becomes great, and timing margin of the driver of the following stage can be secured as much.

7) Still another method of securing the setup/hold time renders the drivers operable even when the setup time of the driver of the following stage is below 0. According to this method, the normal operation can be insured even when the change timing of the data and the clock is simultaneous.

8) Still another method generates the change timing of the data and the clock to the driver of the following stage by using two-phase clocks the phase of which are different by 90 degrees.

9) When the two-phase clocks are used, the date is divided into two groups and two clocks acquire the halves of the data, respectively. In this way, the number of simultaneous switching of the data can be decreased to the half and the noise to the power supply can be reduced. In consequence, EMI can be reduced.

10) In the system described above, each driver first acquires the input data into the internal registers of its own and does not output the data to the driver of the following stage until its registers become full. In this way, useless signal transmission can be omitted, and reduction of both power consumption and EMI can be achieved.

11) In the construction 10) described above, the data must pass through the bucket relay of the number of drivers to reach the object driver after the data to the rearmost driver is outputted from TCON. Therefore, TCON must keep outputting the clocks of the number corresponding to (number of clocks necessary for bucket-relaying one driver.times.number of drivers) after the final data is transmitted.

12) When TCON is mounted by so-called "bare chip mounting" to one of the substrates of the liquid crystal panel in the same was as the driver IC, the mounting area of the peripheral circuits can be reduced advantageously.

13) When TCON is of the LVDS receiver integration type in this instance, the number of input terminals of TCON (=one of the substrates: number of terminals for connecting the lines on the TFT substrate to the external printed substrate) can be drastically reduced, and mounting becomes easier. This is more advantageous for reducing the mounting area of the peripheral circuit.

14) When TCON is mounted by bare chip mounting to the TFT substrate, the mounting position is rationally the corner at which the side having the drain drivers mounted thereto crosses the side having the gate drivers mounted thereto. According to this arrangement, the signal lines can be wired (on the TFT substrate) to both drain and gate drivers in the shortest distance.

15) The bucket relay system among the drivers is also employed also for the gray scale voltage lines as the analog lines. A current, though limited, generally flows from the gray scale voltage input to the DAC section inside the driver in both R-DAC system and C-DAC system. Since the wiring pattern on the liquid crystal panel has a relatively high resistance, this weak current is likely to cause the shift of the gray scale voltage supplied to the driver, and display quality drops.

To prevent this problem, the current flowing through the gray scale voltage input terminals must be lowered to a level that does not render any problem. It is effective for this purpose to dispose a buffer (operational amplifier) at the gray scale voltage input.

16) It is effective from the aspect of efficiency to arrange the terminals for connecting the drivers on the minor side of the driver chip that has not been dealt with as the input terminals. When the input terminals cannot be arranged fully on the minor side, the major side may be used, too.

17) The drain lines and the gate lines inside the liquid crystal panel are short-circuited with one another by common lines (short-circuit lines) to prevent the shift of performance due to static electricity during the production process. The common lines are cut off before the product is completed. In the conventional devices, the common lines are situated below the body of the driver chip and are cut off by means such as laser.

When the lines are extended outside the outer shape of the product of the liquid crystal panel while passing below the body of the driver chip, the common lines can be disposed at a cutting/removing portion outside the product. In this case, the common lines can be cut off simultaneously with the cutting process of the substrate (lower substrate: glass) of the liquid crystal panel. In consequence, the conventional cutting process by using laser can be omitted, and the production cost can be lowered.

18) When the lines for the clock, data and gray scale voltage are wired on the lower substrate (TFT substrate), it is fundamentally only the power supply lines that must be wired on the flexible printed substrate. In any case, the number of lines is only a few. Therefore, even when the flexible printed substrate FPC is not folded to the back of the liquid crystal panel as has been necessary in the conventional system, the required portion is only the width of the compression-bonding portion to the liquid crystal panel. In this case, the construction can be simplified and the outer dimension of the liquid crystal display device can be reduced. Because the assembly work can be simplified, the cost of production can be reduced.

19) In the case 18) described above, when the back of the compression-bonding portion of the flexible printed substrate FPC to the liquid crystal panel is utilized for wiring, design of the flexible printed substrate FPC becomes easier and the cost can be lowered.

20) The flexible printed substrate described above basically has a straight shape (simple straight shape) the width of which is only the width of the compression-bonding portion, but a small number of electronic components such as a chip capacitor must be mounted in many cases to this portion. In this case, the electronic components become the obstacle for compression-bonding of FPC. Therefore, the flexible printed substrate FBC is provided with a portion that protrudes into the arrangement gap between the drivers, and the electronic components can be mounted to this protruding portion without any problem.

Furthermore, the present invention omits the flexible printed substrate FPC, that has been used in the past on the gate side, by forming the data lines and the power supply lines on the gate driver side into a substrate shape. The present invention thus decreases the number of components and simplifies the assembly work. The present invention uses a single-layered flexible printed substrate FPC having only the power supply lines as FPC on the drain driver side, and thus simplifies the construction of the drain driver side FPC. Consequently, the present invention can reduce the number of components and the number of process steps of the liquid crystal display device, and can reduce the cost of production.

The liquid crystal display device according to the present invention mentioned above, should be characterized as follows also. One of examples of the liquid crystal display device is described as a liquid crystal display device comprising, (A) a liquid crystal panel having a pair of substrates, between which a liquid crystal layer is interposed, one of the pair of substrates has a plurality of gate lines extending in a first direction, a plurality of drain lines extending in a second direction transverse to the first direction, and a plurality of pixels being arranged along the first and second directions (in a matrix manner), each of the plurality of pixels has a switching element (or, an active element), (B) a plurality of drain drivers being juxtaposed along the first direction and applying gray scale voltage signals to the switching elements of the plurality of pixels in accordance with display data signals, respectively, (C) a plurality of gate drivers being juxtaposed along the second direction and controlling the switching element, and (D) wiring lines formed on the one of the pair of substrates, respective ones of which supply at least the display data signals and a clock signal to a first one of the plurality of drain drivers arranged at one end of the one of the pair of substrates and transfer the display data signals and the clock signal between the plurality of drain drivers in order from the first one of the plurality of drain drivers, wherein (E) at least one of the plurality of drain drivers has at least one gate circuit being controlled by the clock signal, by which the display data signals and the clock signal are switched either (I) to be acquired by "the at least one of the plurality of drain drivers" or (II) to be transferred to "another of the plurality of drain drivers" being arranged adjacent to the at least one of the plurality of drain drivers. Moreover, in accordance with the same basis mentioned previously, (F) this liquid crystal display device may further comprise a timing converter receiving display data and a timing signal from an external circuit to the liquid crystal display device and generating the display data signals and the clock signal in accordance with the display data and the timing signal, (G) the at least one gate circuit may be provided for each of the plurality of the drain drivers, or (H) the at least one gate circuit may be arranged at least one of an input portion and an output portion of the display data signals and the clock signal provided in the at least one of the plurality of drain drivers in this liquid crystal display device.

Though the typical construction and operations of the present invention have thus been described, other constructions and operations of the present invention will be explained in detail in later-appearing embodiments.

These and other objects, features and advantages of the present invention will become more apparent from the following description when taken in conjunction with the accompanying drawings.

BRIEF DESCRIPTION OF THE DRAWING

FIGS. 9A and 9B are waveform diagrams useful for explaining time constants of signals propagating through signal lines connecting the drivers and for explaining a liquid crystal display device according to the second embodiment of the present invention, wherein FIG. 9A shows a time constant of a pixel clock signal and FIG. 9B does a time constant of a data signal;

FIGS. 11A and 11B are waveform diagrams at the time of acquisition of data by a drain driver in a liquid crystal display device according to the third embodiment of the present invention, wherein FIG. 11A shows a waveform of a pixel clock signal and FIG. 11B does a waveform of a data signal;

FIG. 12 is a block diagram useful for explaining a structural example of internal circuits of a drain driver in a liquid crystal display device according to the fourth embodiment of the present invention;

FIGS. 13A and 13B are waveform diagrams of data and a clock when data acquisition is made at dual edges in the construction shown in FIG. 10, wherein FIG. 13A shows the case of a pixel clock signal and FIG. 13B does the case of a data signal;

FIGS. 14A and 14B are waveform diagrams when a pixel clock is delayed by a delay device at the time of data acquisition at dual edges and a setup time/hold time is regulated by regulating a wiring resistance connecting drain drivers, wherein FIG. 14A shows the case of a pixel clock signal and FIG. 14B does the case of a data signal;

FIGS. 15A and 15B are waveform diagrams of a pixel clock signal and a data signal and are useful for explaining a liquid crystal display device according to the fifth embodiment of the present invention, wherein FIG. 15A shows the pixel clock signal and FIG. 15B does the data signal;

FIGS. 16A and 16B are waveform diagrams of a pixel clock signal and a data signal and useful for explaining a liquid crystal display device according to the sixth embodiment of the present invention, wherein FIG. 16A shows the pixel clock signal and FIG. 15B shows the data signal;

FIGS. 17A and 17B are explanatory views of drain drivers and are useful for explaining a liquid crystal display device according to the seventh embodiment of the present invention, wherein FIG. 17A shows a structural example of an internal circuit of the drain driver and FIG. 17B shows the arrangement of the drain drivers;

FIGS. 43A and 43B are explanatory views of horizontal direction timing about display control in FIG. 38, wherein FIG. 43A is a time chart of signals inputted to a timing converter and FIG. 43B is a timing chart of signals outputted from the timing converter;

FIGS. 44A and 44B are explanatory views of vertical direction timing about display control in FIG. 38, wherein FIG. 44A is a time chart of signals inputted to a timing converter and FIG. 44B is a time chart of signals outputted from the timing converter; and FIG. 45 is an explanatory view of a mounting example of a drain driver, a gate driver and an interface substrate in a liquid crystal display device.

DETAILED DESCRIPTION

Preferred embodiments of the present invention will be explained hereinafter in detail with reference to the accompanying drawings.

Figure 1:
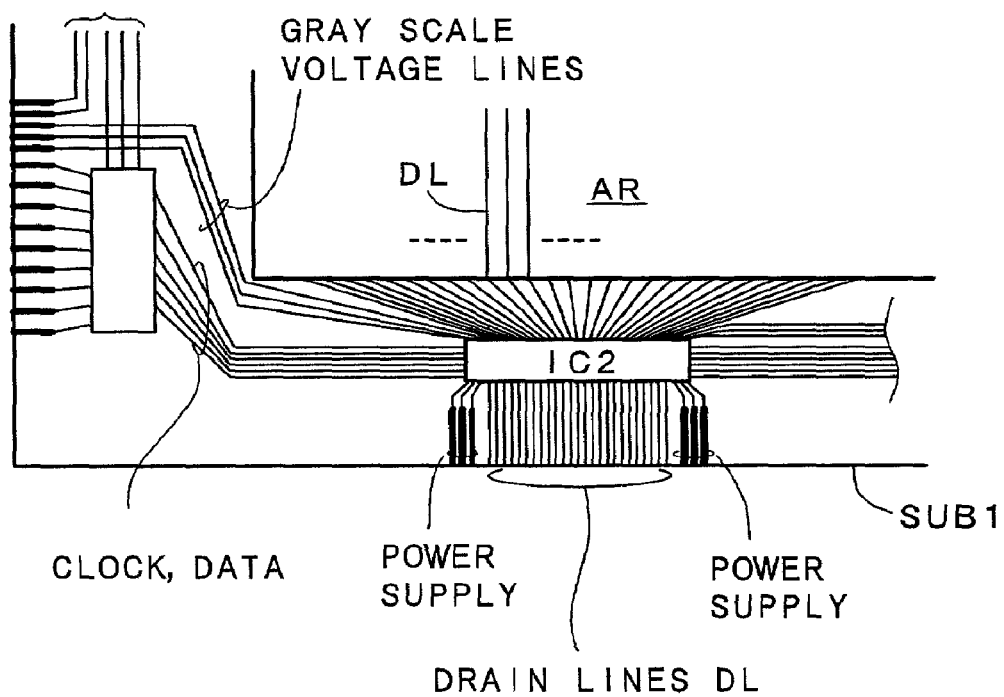
FIG. 1 is a plan view showing the principal portions of a liquid crystal panel and useful for explaining schematically a construction of a liquid crystal display device according to the first embodiment of the present invention.

FIG. 1 is a plan view of the principal portions of a liquid crystal panel and is useful for schematically explaining the construction of a liquid crystal display device according to the first embodiment of the present invention.

A display area AR occupies substantially the whole area of a lower substrate (glass substrate) constituting the liquid crystal panel. Each drain driver IC2 is mounted to the outer edge of the lower side. (Incidentally, the drain driver IC2 may be mounted to the outer edge of the upper side. Alternatively, odd- and even-numbered drain drivers may be alternately mounted to the outer edges of the upper and lower sides.)

A timing converter TCON that constitutes a display controller integrally having a low voltage differential signal reception circuit is mounted to the outer edge of the left side of FIG. 1. The timing converter TCON is of a so-called LVDS (low voltage differential signal) circuit integration type. However, a known TCON may be used, too.

Though not shown in the drawing, a plurality of gate drivers IC1 are directly mounted to the lower substrate SUB1 in the same way as the drain drivers. Data lines for supplying data such as clocks, display data, gray scale voltages and so forth (that will be expressed merely as "data" in the following drawings) to a plurality of drain drivers IC1 are formed on the outer edge of the lower substrate SUB1, to which the drain drivers IC2 are mounted, in such a fashion as to continuously couple the drain drivers IC2. Among these lines, the starting ends of the clock and display data lines are connected to the TCON mounted to the outer edge of the left side.

Each drain driver IC2 is connected at the connection point provided on its lower surface to the lines and supplies the data such as the display data, the pixel clocks and the gray scale voltages to the downstream drain drivers in a bucket relay system. Each drain driver IC2 is connected to the drain line DL on the far side from the display area AR. The power source lines (inclusive of the grounding lines) to this drain driver IC2 are connected to the lines formed on the flexible printed substrate FPC 1 on the later-appearing gate driver side.

Terminals for receiving the display signals, the sync signals and the power supply voltages from an I/F substrate, that is, an interface substrate PCB (see FIG. 45), are provided to the outer edge of the left side in FIG. 1. These terminals are connected to the interface substrate PCB through the flexible printed substrate FPC 1 (see FIG. 45).

Figure 2:
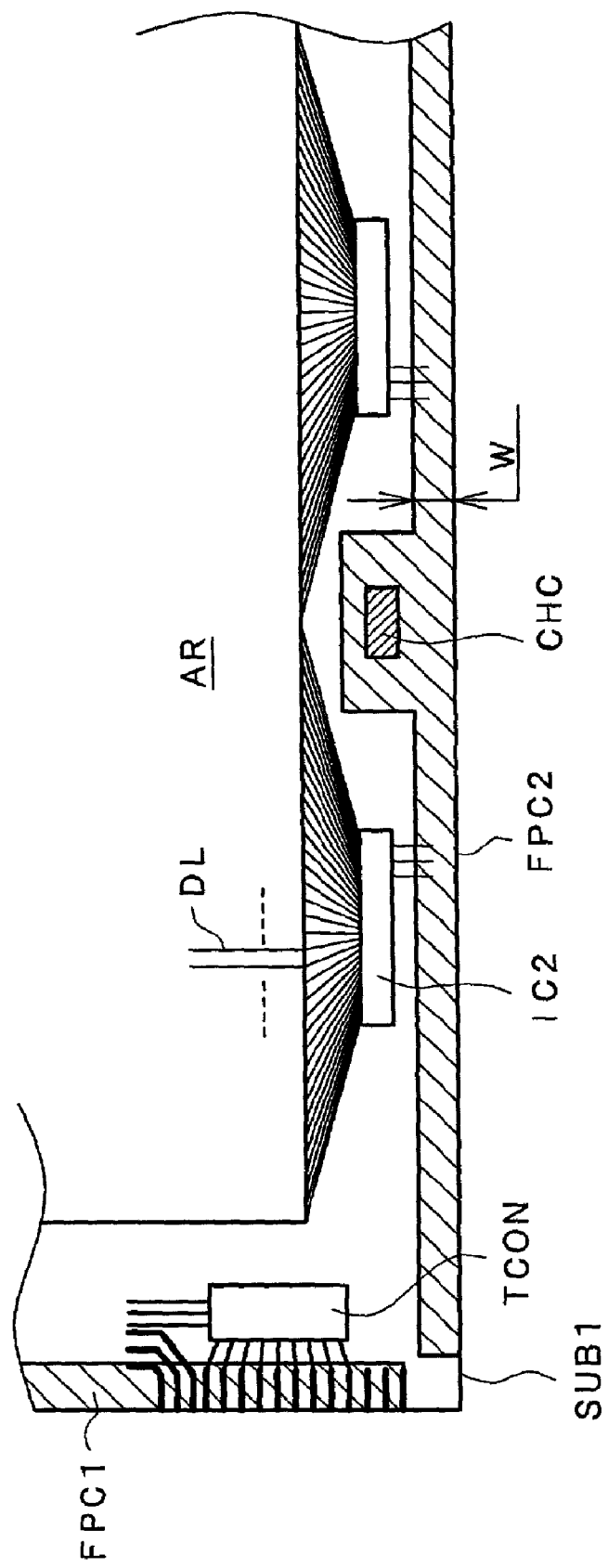
FIG. 2 is a plan view showing the principal portions of a liquid crystal panel and useful for explaining the condition where a flexible printed substrate is disposed on a drain driver side in the embodiment of the present invention shown in FIG. 1.

FIG. 2 is a plan view of the principal portions of a liquid crystal panel, and is useful for explaining the condition where the flexible printed substrate is disposed on the drain driver side in the embodiment of the present invention shown in FIG. 1. Some of the lines shown in FIG. 1 are omitted in this drawing. The main function required for the flexible printed substrate FPC2 on the drain driver side is mainly to connect the lines of the power supply. Since the number of lines may be small and since the substrate need not have a multi-layered wiring structure, this flexible printed substrate FPC2 needs to have only a width for assembly W (a width necessary for compression-bonding to the liquid crystal panel). Therefore, the cost and the width can be drastically reduced in comparison with the conventional liquid crystal display devices.

A part of the flexible printed substrate FPC2 is caused to protrude to the mounting gap of the drain driver IC2, and an electronic component such as a chip capacitor CHC can be mounted to this protruding portion.

Though the explanation has been given on the construction on the drain driver side, the same construction can be employed on the gate driver side, too.

According to this embodiment, the expensive multi-layered flexible printed substrate that has been used in the conventional liquid crystal devices is not at all necessary. Therefore, the overall cost of the liquid crystal display device and the width of the flexible printed substrate can be reduced easily and drastically. Therefore, the reduction of the frame can be easily accomplished in combination with the COG system (or an FCA system: flip-chip system) of the drivers (the drain drivers and the gate drivers).

This embodiment can output a greater number of gray scale voltages than the number of gray scale voltages inputted to the conventional drain drivers. For example, the inputs are 5 (or 10 for positive and negative voltages) and the outputs are 64 gray scales (or 128 levels for positive and negative voltages).

Figure 3:
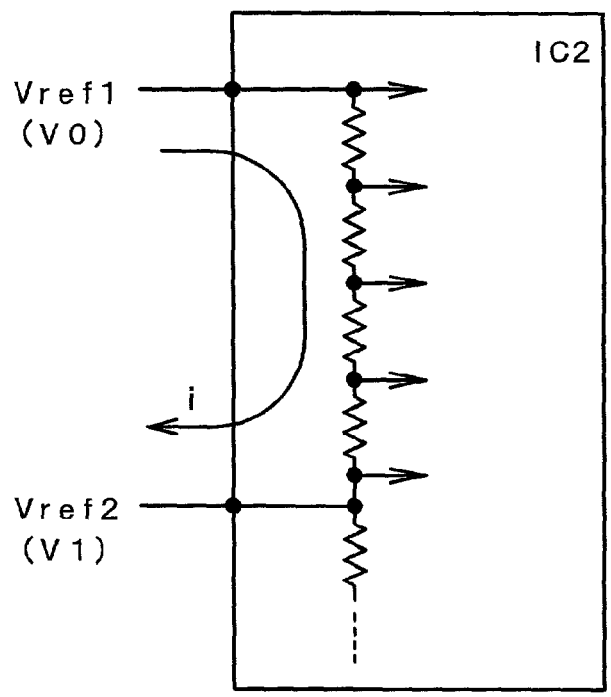
FIG. 3 is an explanatory view of a voltage dividing circuit provided to the drain driver in the embodiment of the present invention.

To achieve the multiple gray scale voltages described above, each drain driver is equipped with a voltage dividing circuit. FIG. 3 is an explanatory view of the voltage dividing circuit provided to the drain driver. Symbol IC2 represents the drain driver, and the voltage dividing circuit comprises a ladder resistor. The gray scale voltages (Vref1, Vref2) inputted to the ladder resistor is divided by means of resistor-division to generate a large number of voltage outputs. Incidentally, capacitance division can also be used besides such resistance division.

In this construction, however, an inflow current i flows from one of the gray scale voltages Vref1 (V0) to the other Vref2 (V1) and the input gray scale voltages (Vref1 and Vref2) fluctuate with the result that the gray scale voltage output as the division output fluctuates and invites display non-uniformity.

To avoid fluctuation of the gray scale voltage outputs, the present invention inserts a buffer amplifier (an operation amplifier) on the input side of the gray scale voltage.

Figure 4:
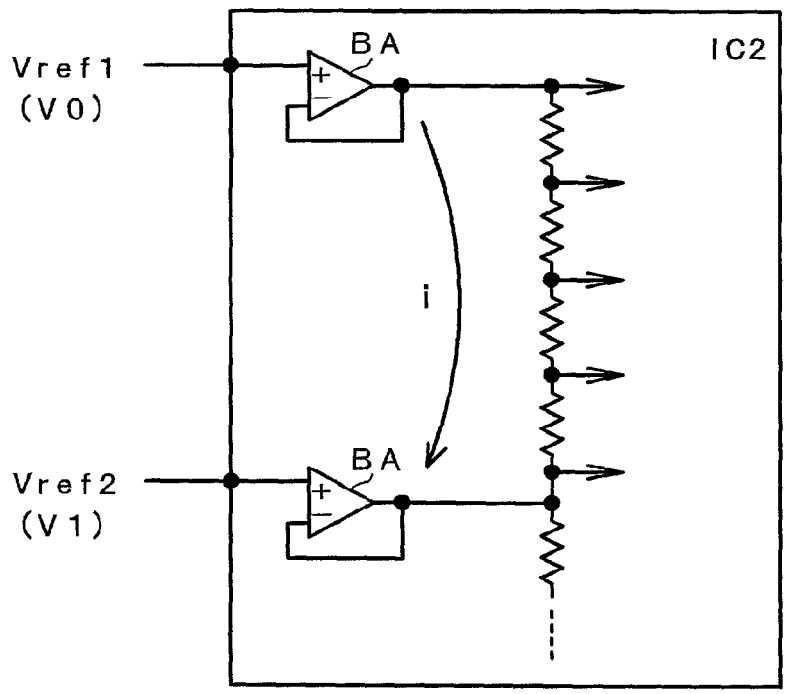
FIG. 4 is an explanatory view of an example of the voltage dividing circuit of the drain driver in the embodiment of the present invention.

FIG. 4 is an explanatory view of another example of the voltage dividing circuit of the drain driver IC2 in the embodiment of the present invention. A buffer amplifier BA is disposed on the input side of each gray scale voltage Vre1, Vref2 as shown in the drawing. In this construction, the current flowing through the voltage dividing circuit (the ladder resistor circuit) is supplied from the buffer amplifier BA. Therefore, the inflow current i does not flow from one of the gray scale voltage inputs Vref1 (V0) to the other Vref2 (V1), that occurs in the case of FIG. 3, and no fluctuation develops in the gray scale voltage output generated by resistance division.

Because the impedance on the input side of the buffer amplifier BA is extremely high, the inflow current from the gray scale voltage input terminal Vref can be substantially neglected. Therefore, the occurrence of display non-uniformity resulting from fluctuation of the gray scale voltage input Vref can be checked even when high resistance wiring on the thin film transistor substrate (TFT substrate) SUB1 is used.

Figure 5:
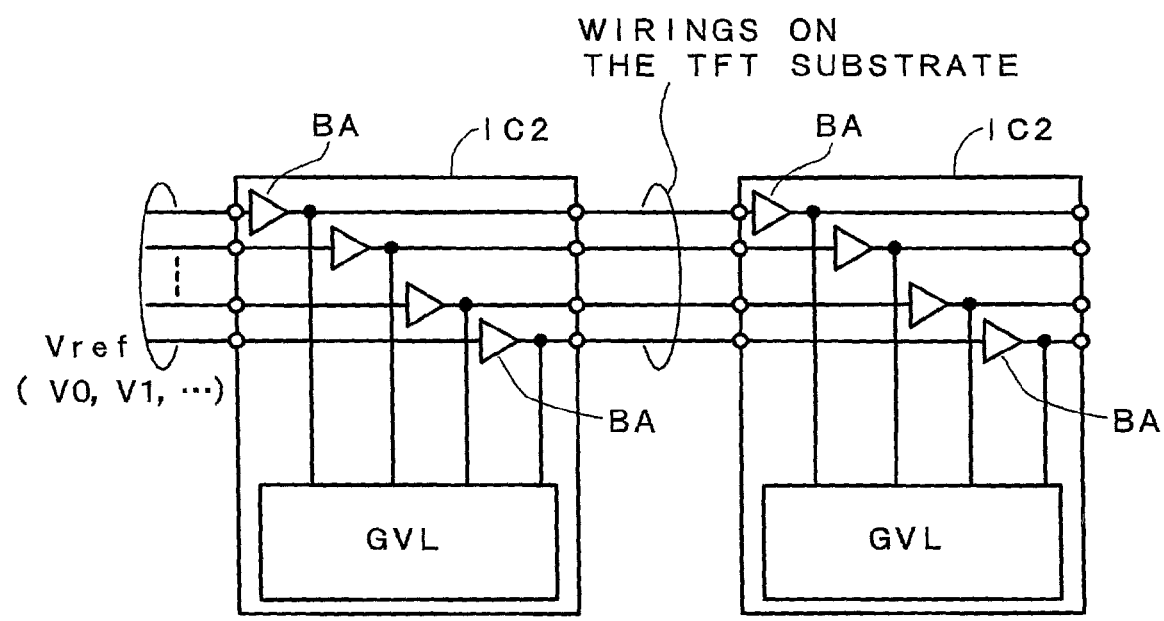
FIG. 5 is an explanatory view of a mounting example of lines and drain drivers formed on a thin film transistor substrate in the embodiment of the present invention.

FIG. 5 is an explanatory view of a mounting example of the lines and the drain drivers formed over the thin film transistor substrate in the embodiment of the present invention. This drawing shows two drain drivers IC2 and IC2 that are adjacent to each other. Symbol GVL represents a voltage dividing circuit that corresponds to a gray scale voltage generating circuit that will be explained later with reference to FIG. 6. Each drain driver IC2, IC2 is connected to the lines (shown as the wiring over the TFT substrate in the drawing) formed over the thin film transistor substrate SUB1 in the construction shown in the drawing. A buffer amplifier BA is interposed between the gray voltage input line over the TFT substrate and the input terminal of the voltage dividing circuit GVL of each drain driver IC2, IC2.

In this embodiment, the number of the gray voltage input lines (Vref lines) is 5 for each of the positive and the negative voltages, or 10 in all, as described already, but this number is of course not limitative.

Figure 6:
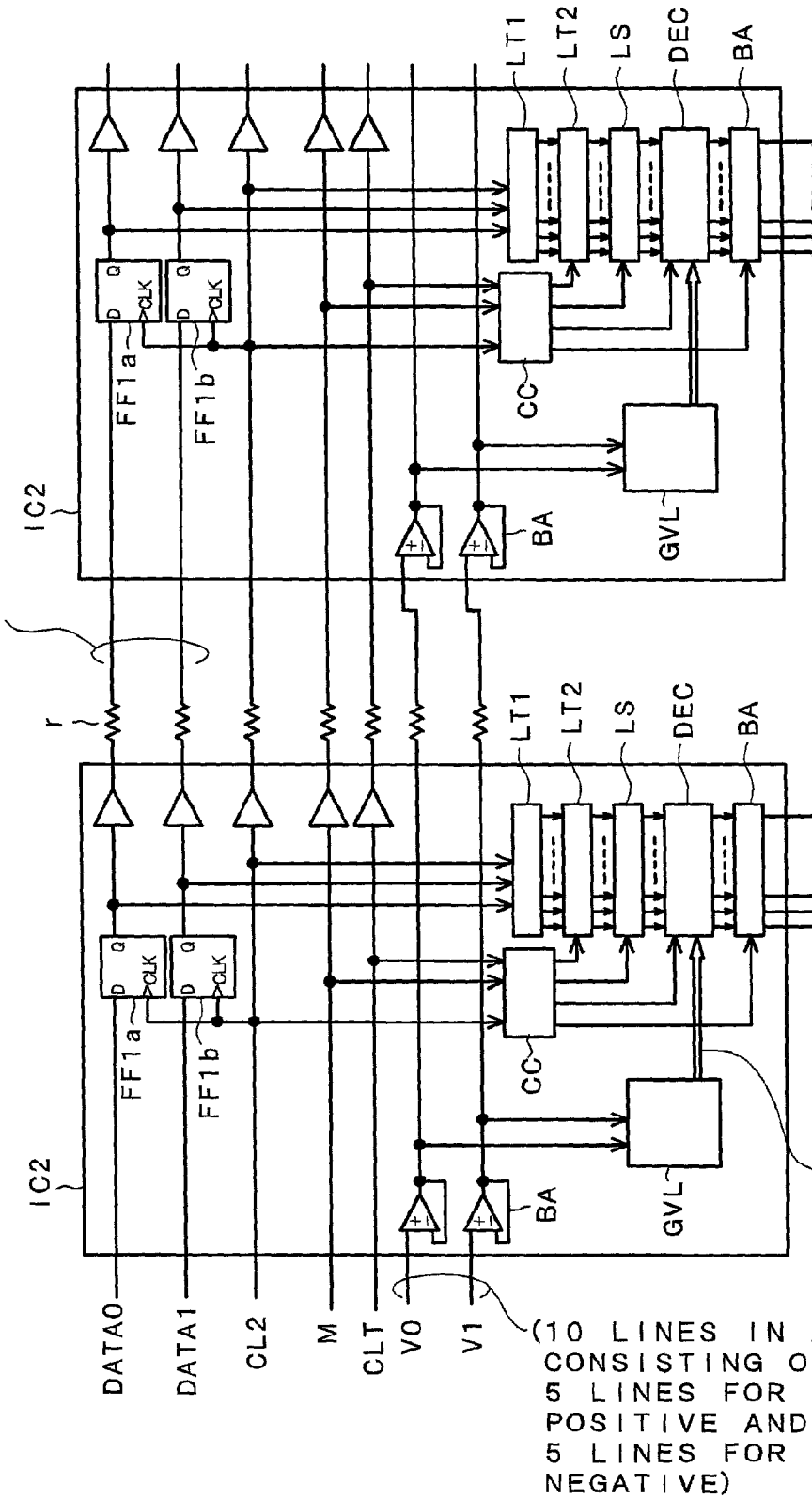
FIG. 6 is a block diagram useful for explaining a structural example of a drain driver of a series supply system according to the present invention.

FIG. 6 is a schematic circuit diagram useful for explaining in detail a structural example of a series supply system drain driver. In FIG. 6, a plurality of drain drivers IC2, . . . are shown connected in series by lines formed on the lower substrate.

IC2 on the left side of the drawing is a drain driver of a preceding stage and IC2 on the right side is a drain driver of a following stage.

The display data DATA0, DATA1, the clocks CL1, CL2, the inversion signal M and the gray scale voltages V0, V1 that are inputted from the drain driver IC2 of the preceding stage are supplied to the drain driver of the following stage through the lines on the lower substrate that mutually connect the drain drivers.

In this embodiment, eighteen display data lines exist originally but the drawing shows only two lines DATA0 and DATA1 to simplify the illustration. Similarly, the drawing shows only two of the ten gray scale voltage lines.

Each drain driver IC2 comprises flip-flops FF1$a$, FF1$b$, a gray scale voltage generating circuit GVL, a clock controlling circuit CC, a latch circuit (1) LT1, a latch circuit (2) LT2, a level shifter LS, a decoder DEC and a buffer amplifier BA.

Display data DAT0, DATA1 are latched by the latch circuit (1) LT1 through the flop-flops FF1$a$, FF1$b$, are inputted to the decoder DEC through the latch circuit (2) LT2 and the level shifter LS under control of the clock controlling circuit, and are converted to a predetermined display voltage on the basis of the gray scale voltage from the gray scale voltage generating circuit GVL. The output of the decoder DEC is applied to the drain line DL of the liquid crystal panel through the buffer amplifier BA.

Figure 7:
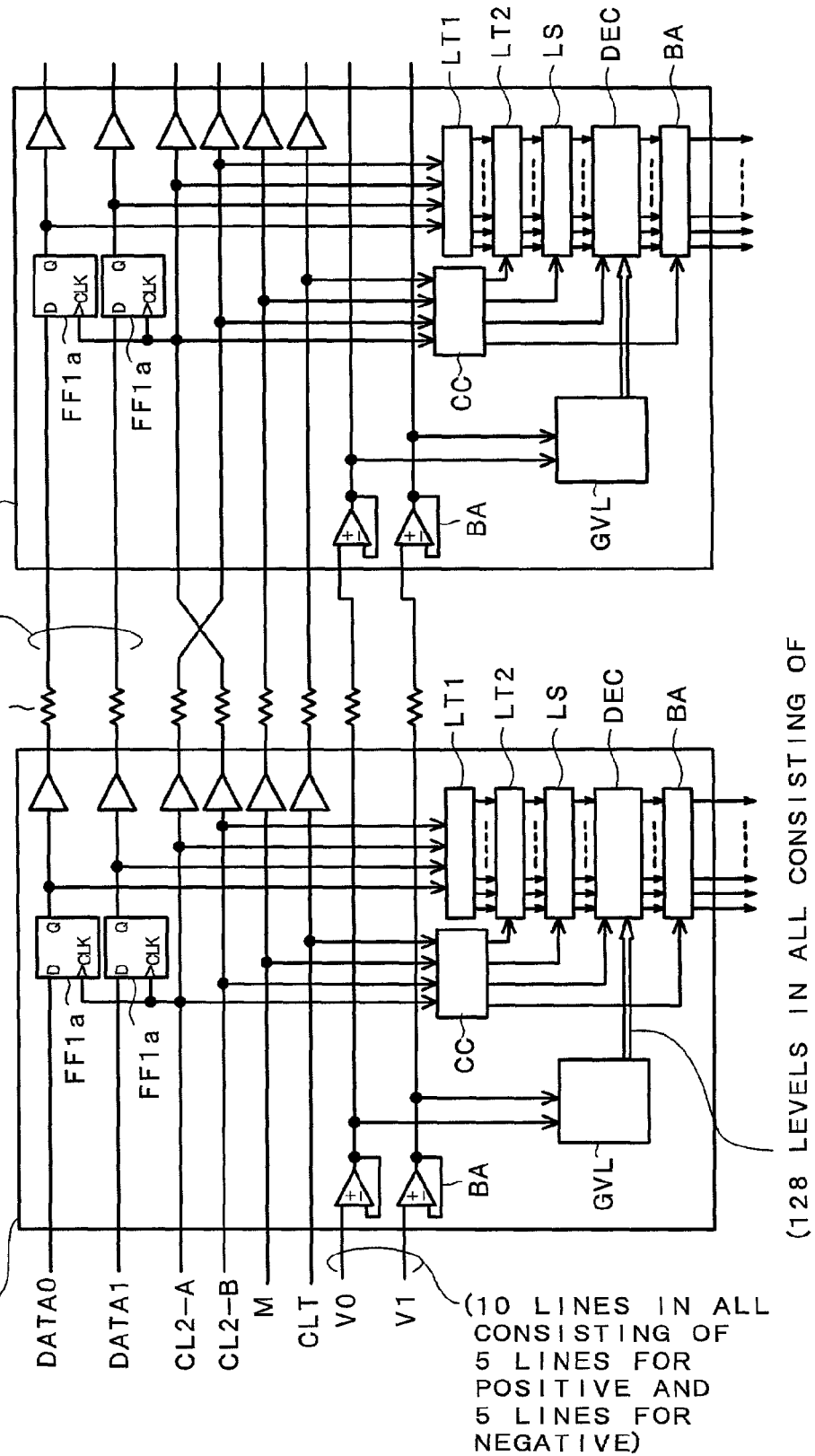
FIG. 7 is a block diagram useful for explaining another structural example of the drain driver of the series supply system according to the present invention.

FIG. 7 is a schematic circuit diagram useful for explaining still another structural example of the series supply system drain driver according to the present invention. In this construction, CL2 as the pixel clock is two-phase clocks CL-2A and CL2-B and is the same as FIG. 6 with exception of this point.

Figure 8:
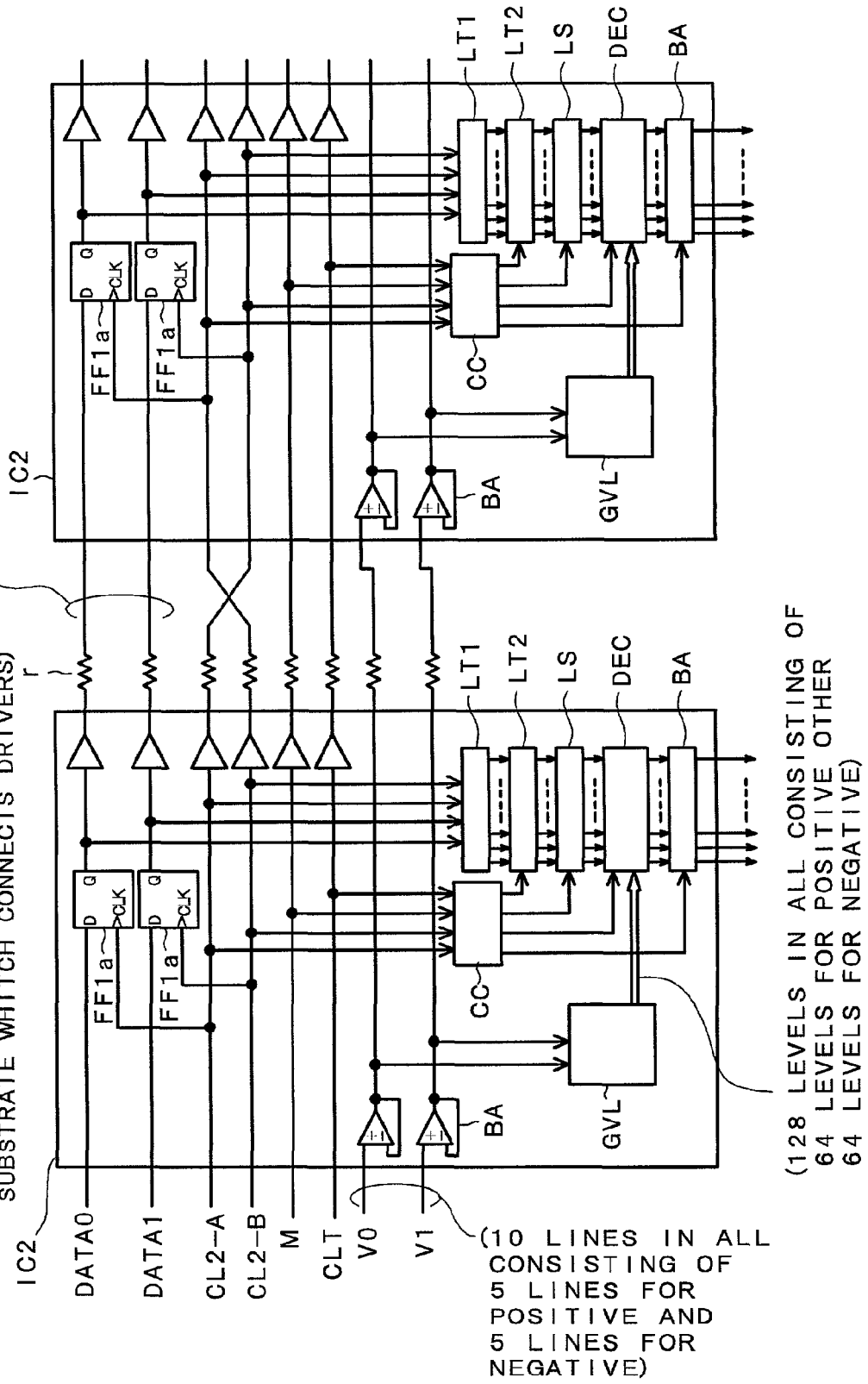
FIG. 8 is a block diagram useful for explaining still another structural example of the drain driver of the series supply system according to the present invention.

FIG. 8 is a schematic circuit diagram useful for explaining still another structural example of the series supply system drain driver according to the present invention. In this construction, the pixel clock CL2 has two phases and the display data is outputted after being divided into two groups. The construction is the same as that of FIG. 7 with exception of this point.

The waveforms of the signals (clocks, data) propagating through the lines connecting the drivers become dull when the resistance of the lines is too high, and the data cannot be applied normally. When the resistance is too low, on the other hand, the high frequency components occurring during signal transfer generate electromagnetic interference waves, that is, unnecessary radiation (EMI). In this construction, components to cope with this problem such as an EMI filter cannot be inserted into the lines connecting the drain drivers IC1. To solve this problem, the present invention takes the following measures for the waveforms.

Figure 9A:
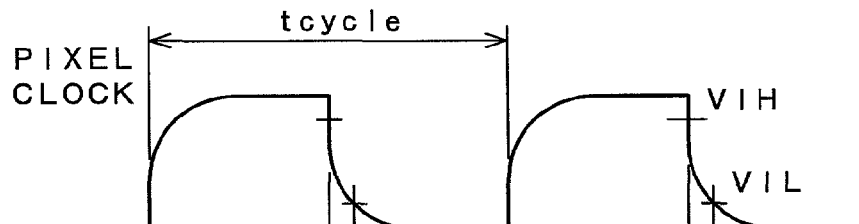
Figure 9B:
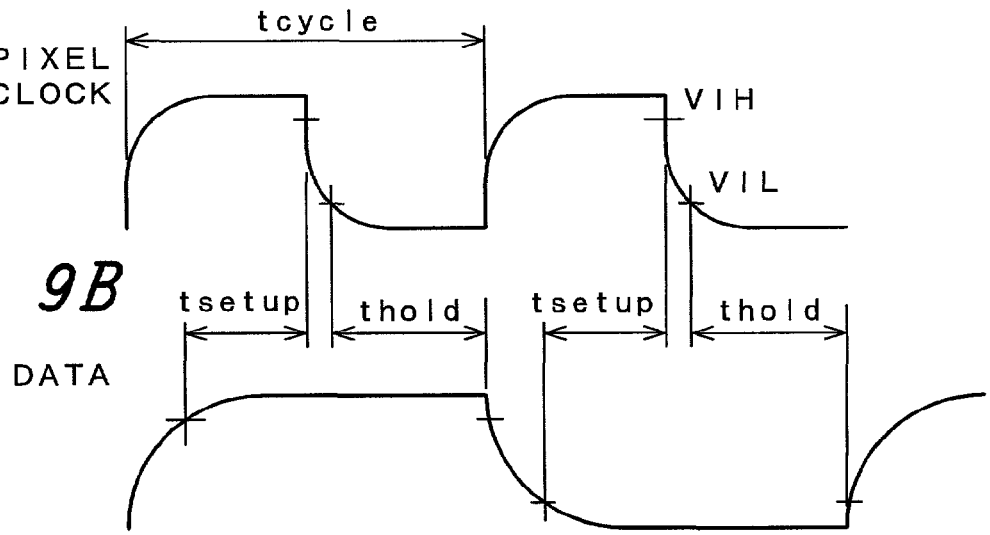

FIGS. 9A and 9B are waveform diagrams useful for explaining the time constants of signals propagating through the signal lines connecting the drivers in the liquid crystal display device according to the second embodiment of the present invention. The waveform shown in FIG. 9A represents the pixel clock and the waveform of FIG. 9B does the display data. The waveforms are those of the system that inputs the data at the fall edge of the pixel clock CL2.

Symbol t cycle represents the cycle of the pixel clock and the data is inputted in synchronism with the fall of this clock. The time constant .tau. of the signal line is so set as to substantially satisfy the relation $\tau=(t_{cycle}-t_{setup}-t_{hold})/2$ and to render appropriately the waveform dull. This is the condition that is set from the aspect of "rendering the waveform dull to maximum while the timing margin at which the driver can normally operate is secured".

Here, $t_{setup}$ and $t_{hold}$ are the minimum necessary setup time and hold time required for the drain driver to normally acquire the data.

This embodiment can secure the normal operation of the driver, and can reduce EMI by rendering the waveform dull.

Incidentally, each signal is delayed by a signal delay component inside the driver in the bucket relay system driver construction, and this delay amount has variance for each signal line. This variance includes variance of design of the driver, variance of production, variance resulting from the fluctuation of the operation depending on the ambient conditions such as the operation temperature.

When variance of the delay amount becomes great, the timing margin required by the driver cannot be secured and the driver fails sometimes to acquire the correct data. Therefore, if the driver ICs (particularly, the drain drivers) are merely connected in the bucket relay system, the delay amount accumulates in each driver and the operation of the drivers of following stages becomes more unstable when they acquire the data. When the flip-flops FF1$a$ and FF1$b$ are disposed on the input side as shown in FIGS. 6 to 8, the delay can be covered to a certain extent, but the present invention further employs the following construction.

Figure 10:
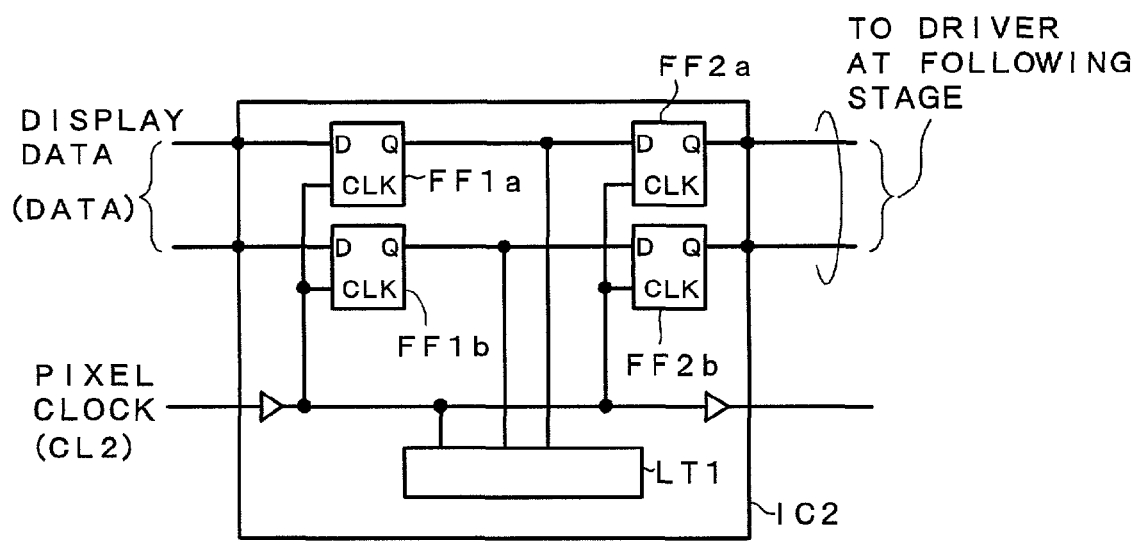
FIG. 10 is a block diagram useful for explaining a structural example of internal circuits of a drain driver and for explaining a liquid crystal display device according to the third embodiment of the present invention.

FIG. 10 is a block circuit diagram useful for explaining a structural example of internal circuits of the drain drivers in the liquid crystal display device according to the third embodiment of the present invention. This drawing shows only the principal portions (in the same way as in the later-appearing drawings) because FIGS. 6 to 8 depict the overall construction. In the drawings, symbol IC2 represents a drain driver. Flip-flops FF2$a$ and FF2$b$ are disposed on the output side (on the side of a driver of a following stage), too, in addition to the flip-flops FF1$a$ and FF1$b$ on the input side (on the side of a driver of a preceding stage) in the drain driver.

The number of lines of the display data is 20+α for XGA, for example (including the inversion signal of the clock CL1, etc). The number of flip-flops (FF1$a$, FF1$b$, FF2$a$, FF2$b$) disposed on the input side and the output side, respectively, is the same as the number of these signals.

The latch circuit (1) LT1 acquires the data from the drain driver of a preceding stage in synchronism with the pixel clock CL2 in the flip-flops FF1$a$ and FF1$b$. The output is given to the drain driver of a following stage in synchronism with the clock CL2 in the flip-flops FF2$a$ to FF2$b$.

The flip-flops shown in the drawing are of the D type, but they may be of other types. It is also possible to employ the construction in which the flip-flops FF2$a$ and FF2$b$ are disposed on only the output side (not shown in the drawing).

According to this construction, the delay amount does not accumulate in each driver. In consequence, all the drivers can normally operate, the erroneous acquisition of the data can be avoided and stable display can be obtained.

The display data is applied to the drain driver in synchronism with the fall of the pixel clock. Because one data is applied in one cycle of the pixel clock, the frequency of the pixel clock becomes higher as resolution becomes higher, and the problem of EMI (interference of the electromagnetic waves to outside) cannot be neglected. The present invention reduces EMI in the following way.

FIGS. 11A and 11B are waveform diagrams when the drain driver acquires display data in the liquid crystal display device according to the third embodiment of the present invention. In the circuit construction shown in FIG. 6, this embodiment acquires the display data shown in FIG. 11B at both rise and fall edges of the pixel clock shown in FIG. 11A (dual edge acquisition). In other words, the former half of the display data shown in FIG. 11B is acquired at the fall edge of the pixel clock shown in FIG. 11A and its latter half, at the rise edge of the pixel clock. In FIGS. 11A and 11B, VIH, VIL, $t_{setup}$ and $t_{hold}$ have the same meaning as in FIGS. 9A and 9B. This embodiment can halve the pixel clock frequency and can reduce EMI as much.

In the case of acquisition of the display data at the dual edges of the pixel clock described above, it is sometimes difficult to output the signal having the timing explained with reference to FIG. 10 from the drain driver. Since the clock during operation has the frequency corresponding to the half of the normal frequency, the timing for changing the display data to be outputted to the drain driver of the following stage is difficult to secure in the flip-flops FF2a and FF2b of the output stage. (In the case of the normal single edge, the driver can change the display data without any problem at the timing of the clock edge that is not used for acquiring the display data. In the case of FIG. 10, for example, the output data is changed at the timing of the rise edge of the pixel clock.)

FIG. 12 is a schematic circuit diagram useful for explaining internal circuits of the drain driver in the liquid crystal display device according to the fourth embodiment of the present invention. In this embodiment, a delay device dL is disposed at the output stage of the clock wiring (clock line). This delay device can be constituted by known means that connects a plurality of inverter circuits in series, for example.

FIGS. 13A and 13B are waveform diagrams of the display data signal (FIG. 13B) and the pixel clock signal (FIG. 13A) when the data is acquired by the dual edge system in the construction shown in FIG. 10. As shown in FIGS. 13A and 13B, the setup time $t_{setup}$/hold time $t_{hold}$ cannot be secured in this case.

FIGS. 14A and 14B show the case where the pixel clock is delayed by the delay device dL (see FIG. 14B) when the display data is acquired by the dual edge system (see FIG. 14B). The drawings also show the waveforms when the wiring resistance connecting the drain drivers is adjusted so as to adjust the setup time $t_{setup}$/hold time $t_{hold}$. In this way, the timing requirement for acquiring the data can be secured.

The wiring resistance can be adjusted by known means such as laser trimming that changes the wiring width, length or thickness. Alternatively, it can be adjusted by changing the wiring material. In this way, the wiring delay amount can be adjusted.

Digital ICs in general require a certain total time of the setup time $t_{setup}$ and the hold time $t_{hold}$ at the time of acquisition of the data. A design change is relatively easy to sacrifice one of them so as to shorten the other. Therefore, when the construction that sets the necessary setup time to 0 (or below) is employed (though the necessary hold time becomes longer as much), the display data can be acquired without problem even in the case of the waveform shown in FIG. 13A. Needless to say, the hold time may be reduced to 0 or below at the sacrifice of the setup time.

According to this embodiment, because the setup time (or the hold time) necessary for the drain driver to acquire the display data is 0 or below, it is possible to secure the setup time $t_{setup}$/hold time $t_{hold}$ at the time of data acquisition without any specific contrivance on the display data sending side.

FIGS. 15A and 15B are waveform diagrams of the display data and the pixel clock and are useful for explaining the liquid crystal display device according to the present invention. As shown in FIG. 15A, two-phase pixel clocks A and B the phases of which are different by 90 degrees are supplied from TCON. When a drain driver of a preceding stage outputs the display data to a drain driver of a following stage in FIG. 15B, the data outputted in synchronism with the edge of one of the pixel clocks is changed, and the other pixel clock is sent as an operation clock for the drain driver of the following stage. In other words, in FIG. 14A, the data outputted in synchronism with both edges of the clock A is changed. The receiving side acquires the display data in synchronism with both edges of the clock B. In consequence, the setup/hold time can be secured when the drain driver of the following stage acquires the display data, by increasing one clock line.

FIGS. 16A and 16B are waveform diagrams of the display data and the pixel clock and are useful for explaining the liquid display device according to the sixth embodiment of the present invention. As shown in FIGS. 16A and 16B, the input and output terminals for the display data are divided into two sets, respectively. One of the two-phase pixel clocks latches one set of the data and the other does the data of the second set. In the data group A in FIG. 15B, the data outputted in synchronism with both edges of the clock A shown in FIG. 15A is changed. The receiving side acquires the display data in synchronism with both edges of the clock B shown in B in FIG. 15A.

As represented by C in FIG. 15B, the data group B changes the data to be outputted in synchronism with both edges of the pixel clock B, and the receiving side acquires the data in synchronism with both edges of the pixel clock A as represented by D in FIG. 15A.

When the lines for the display data are divided into two sets and are changed at different timings, the power supply and the ground (GND) become stable and EMI can be reduced.

Figure 17A:
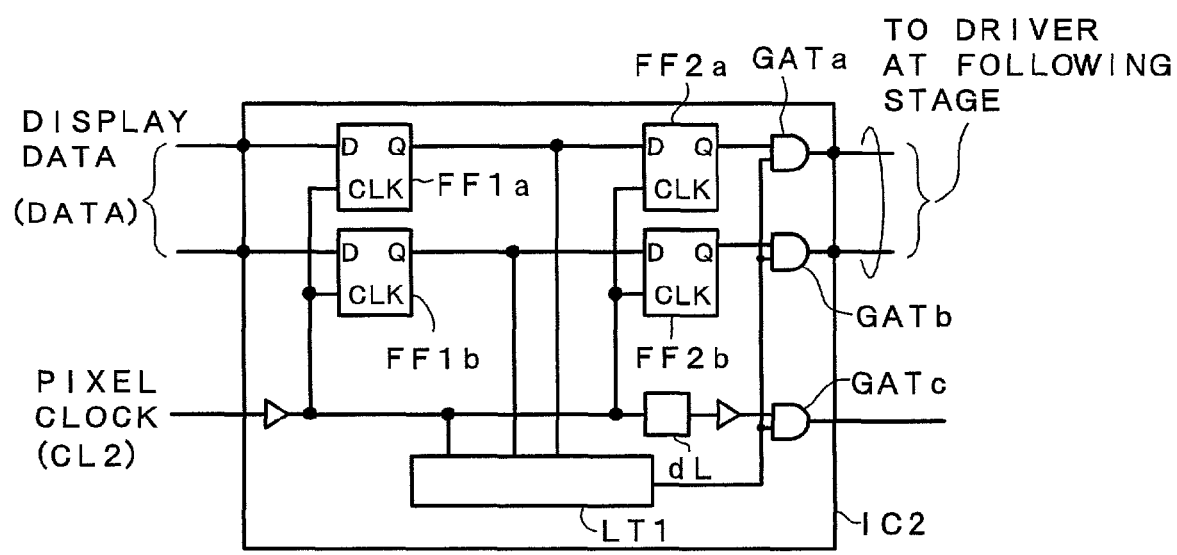
Figure 17B:
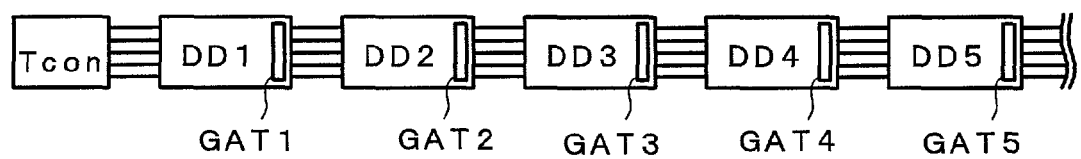

FIGS. 17A and 17B are explanatory views of the drain driver in the liquid crystal display device according to the seventh embodiment of the present invention. FIG. 17A is a block circuit diagram showing a structural example of internal circuits of the drain driver and FIG. 17B is an explanatory view of the arrangement and operation of the drain driver.

In this embodiment, gates GATa, GATb and GATc are disposed at the display data output and the pixel clock output of the drain driver IC2 as shown in FIG. 17A. These gates GATa, GATb and GATc inhibit the supply of the display data and the clock to the drain driver of the following stage when the drain driver IC2 acquires the display data of its own, and start supplying the display data and the pixel clock to the drain driver of the following stage when the internal register inside its own, that is, the latch circuit (1) LT1, becomes full.

In the construction shown in FIG. 17B, a gate GAT1 to GAT5 comprising the GATa, GATb, GATc shown in FIG. 17A is disposed on the output side of each drain driver DD1 to DD5 comprising the drain driver IC2. The timing converter TCON first outputs the display data for the drain driver DD1. In this instance, the gate GT1 of the driver DD1 is inhibited and the output terminal to the drain driver DD2 of the following stage is non-driving. Quite naturally, all the drain drivers DD3, DD4, and so on, subsequent to the drain driver DD2, do not operate at all and are at rest.

When the drain driver DD1 finishes acquiring the display data it must acquire, it opens the gate GAT1, drives the output terminal of the drain driver DD2 and lets this drain driver DD2 start acquiring the display data. Under this condition, both drain drivers DD1 and DD2 are under the operating condition (with DD1 being merely sending the data).

Finishing acquiring the display data, the drain driver DD2 brings the data line to the drain driver DD3 into the driving condition. Thereafter, the display data is supplied serially in the same way to the drain drivers DD3, DD4, and so forth.

According to this construction, each drain driver does not execute the unnecessary operation and can achieve lower power consumption. Also, EMI to external equipment can be reduced.

Incidentally, the flip-flops FF1a, FF1b, FF2a and FF2b are provided on both input and output sides of the display data of the drain driver and the delay device DL is disposed on the output side of the pixel clock line in FIG. 17A. However, it is also possible to employ the construction wherein the flip-flops FF1a, FF1b, FF2a and FF2b are disposed on only either one of the input and output sides of the data, or the construction in which the delay device dL is not disposed.

The detailed construction corresponds to the construction in which the gates GATa, GATb and GATc shown in FIG. 17A are added to the display data output side and the pixel clock output side of the drain drivers shown in FIGS. 6 to 8.

The eighth embodiment of the present invention employs a construction to execute the following operation. When the input operation of the image clock from the timing converter TCON is started, the drain driver does not acquire its own display data but transfers merely the signal to the drain driver of the following stage. Only after receiving the carrier signal from the drain driver of the following stage, the drain driver starts acquiring the display data of its own.

At this time, driving of the display data line and the pixel clock line of the following stage is stopped. When the internal registers of its own become full, the drain driver sends the carry signal to the drain driver of the preceding stage. As this operation is repeated, the display data is packed to the drain drivers situated at far positions (remote end) from the timing converter TCON.

Drain driver ICs in general have the function of selecting from which side the inputted display data is to be packed into the internal register (latch circuit) so that the drivers can be mounted to either of the upper and lower sides of the liquid crystal panel. In this embodiment, the flow of the signals is basically unidirectional, and this function cannot be materialized when the sequence of packing the display data into the internal registers is merely changed. Therefore, this embodiment employs the construction in which the drain drivers IC at the remote end of the drain driver group connected in series first starts receiving the display data and when its internal registers become full, the carrier signal is sent serially to the drain driver of a preceding stage. Receiving the carry signal, the drain driver IC recognizes its turn and starts acquiring the display data into the internal registers of its own. At this time, the drain driver IC stops driving the data lines to the following stage(s) that has become unnecessary any more. This construction can be materialized on the basis of the construction shown in FIG. 17A.

The ninth embodiment of the present invention employs a construction to execute the following construction. In each of the foregoing embodiments described above, the timing converter TCON outputs excessively the clocks corresponding to at least (internal latency per driver)×(number of IC chips) after sending the final data and then stops outputting the clocks.

In the drain drivers having the internal construction shown in FIG. 10, one clock is necessary whenever each flip-flop operates. In this case, several clocks are necessary before the data inputted to a certain driver is outputted to a driver of the following state (2 clocks in the construction shown in FIG. 10).

Therefore, to send the data to the drain driver at the far end from the timing converter TCON, the number of required clocks is (number of clocks required for each drain driver) .times.(number of drains) before the data outputted from the timing converter TCON reaches the drain driver at the far end.

At least the number of clocks described above is essentially necessary, but the clocks are thereafter not always necessary. Therefore, if the output from TCON is stopped, both power consumption and EMI can be reduced.

Figure 18:
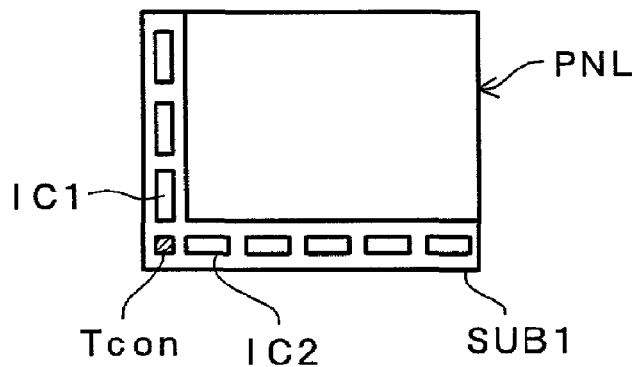
FIG. 18 is a schematic plan view useful for explaining a liquid crystal panel in a liquid crystal display device according to the eighth embodiment of the present invention.

FIG. 18 is a schematic plan view useful for explaining the liquid crystal display device according to the tenth embodiment of the present invention. In this embodiment, the timing converter TCON used in each of the foregoing embodiments is mounted to one of the substrates of the liquid crystal panel PNL, that is, to the TFT substrate SUB1 as the lower substrate, by so-called "bare chip mounting".

The timing converter TCON is the components having the greatest size (package size) among the electronic components used for the liquid crystal display device, and renders a large obstacle to accomplish miniaturization of the liquid crystal display device.

In this embodiment, the timing converter TCON is mounted by bar chip mounting to the lower substrate SUB1 of the liquid crystal panel PNL. The mounting position is suitably a corner portion at which the mounting side of the drain driver IC2 and the mounting side of the gate driver IC1 are adjacent to each other, from the aspect of space efficiency, but this position is not particularly restrictive. Since the output signal of the timing converter TCON is supplied to both drain driver and gate driver, however, the wiring length can be shortened when the timing converter TCON is mounted to the corner that is close to both drivers. EMI can be reduced, too, in this case. This embodiment facilitates miniaturization of the liquid crystal display device.

In the eleventh embodiment of the present invention, the timing converter TCON is of an LVDS receiver integration type. The LVDS integration type TCON has a drastically smaller number of input terminals than other TCONs. When TCON of the types other than the LVDS integration type is directly mounted to the substrate of the liquid crystal panel, the number of terminals for connecting the liquid crystal panel to the interface substrate does not much change in comparison with conventional types in which the TCON is mounted to the interface substrate. When the LVDS integration type TCON is directly mounted to the substrate of the liquid crystal panel as in this embodiment, the number of terminals becomes drastically smaller. In consequence, reliability can be improved through enlargement of the connection pitch. Because the number of connector pins for connection can be reduced, too, the cost can be reduced.

In the twelfth embodiment of the present invention, a buffer amplifier BA is disposed at the input terminal of each gray scale voltage V0, V1 of the drain driver as shown in FIGS. 6 to 8, and the gray scale voltage is supplied by a sequential series system, or a so-called "bucket relay system", between the drain drivers.

The number of the gray scale voltage inputs is great and next to that of the display data inputs. If they need not be wired through the flexible printed substrate FPC, the production cost can be further reduced. Generally, however, the wiring resistance on the liquid crystal panel is high and a current of a certain degree flows through the gray scale voltage input terminals (in either of so-called "R-DAC system" and "C-DAC system"). These current and resistance value on the liquid crystal panel invite the shift of the gray scale input voltage from a desired voltage. In consequence, non-uniform display occurs in each drain driver.

When the buffer amplifiers are disposed for the gray scale voltage input terminals as in this embodiment, the input current described above can be reduced to the negligible level, and the occurrence of display non-uniformity can be avoided.

Incidentally, it is also possible to dispose a sample-and-hold circuit on the gray scale voltage input side of the drain driver so that a plurality of gray scale voltages can be supplied on the time division basis. Generally, ten to twenty gray scale voltage input terminals are used, but when the time division input system is used, only one gray scale voltage input terminal needs be used. In this case, the gray scale voltage outputted from the display control device is of the series type. This can be accomplished by a known circuit construction technology. As a result, the number of wiring lines can be decreased, and the frame size and the cost of the liquid crystal panel can be reduced.

Figure 19:
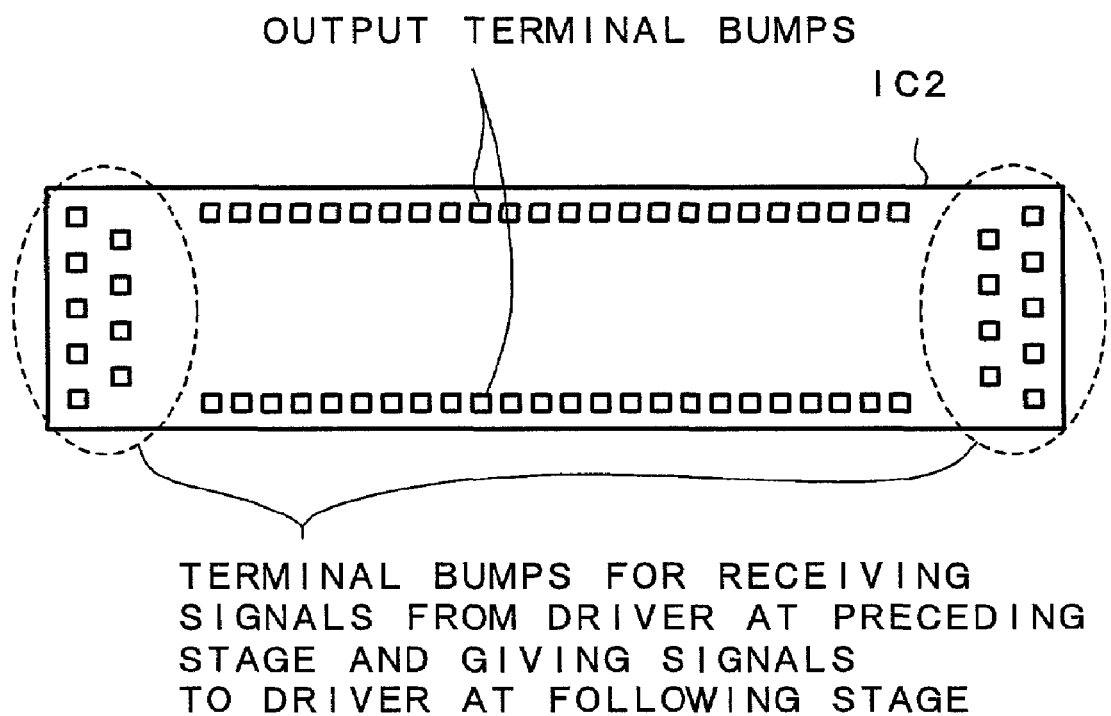
FIG. 19 is a schematic view useful for explaining a terminal arrangement of drain drivers in a liquid crystal display device according to the eleventh embodiment of the present invention.

FIG. 19 is a schematic view of the terminal arrangement of the drivers and is useful for explaining the thirteenth embodiment of the present invention. In this embodiment, the terminals for driving the liquid crystal panel (drain line driving terminals) among the output terminals of the drain drive IC2s are assorted to both major sides of the drain driver IC2 chip in such a fashion that the terminal bumps are uniformly distributed inside both major sides of the chip. The terminal bumps necessary for exchanging the signals with the drain drivers of the preceding and following drain drivers are arranged on both minor sides of the chip.

When the terminal bumps exist non-uniformly inside the IC chip, the pressure does not act uniformly on each terminal bump and eventually invites a connection defect at the time of connection by ACF (anisotropic conductive film).

The construction of this embodiment can mitigate the area of the terminal bumps and can therefore insure connection having high reliability.

Figure 20:
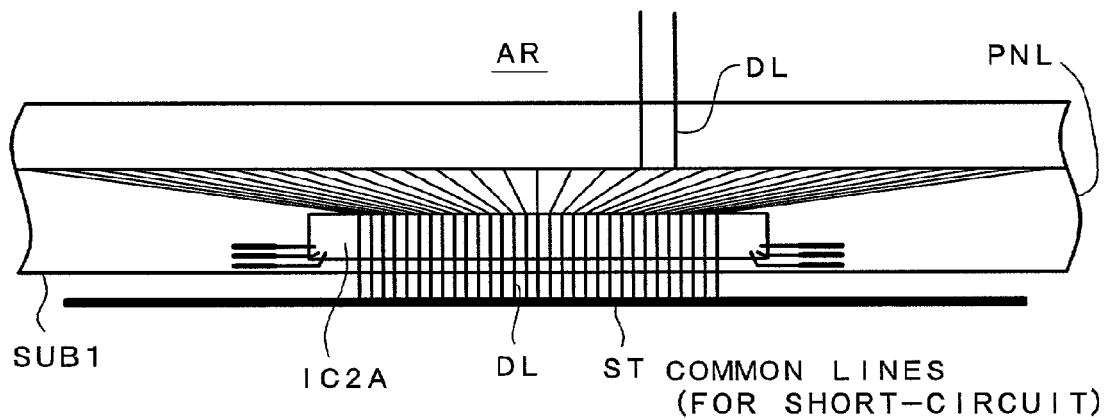
FIG. 20 is a plan view of the principal portions of a liquid crystal panel and is useful for explaining schematically a liquid crystal display device according to the twelfth embodiment of the present invention.

FIG. 20 is a plan view of the principal portions of the liquid crystal panel and is useful for typically explaining the fourteenth embodiment of the present invention. The display area AR occupies substantially the whole area of the lower substrate (glass substrate) SUB1 that constitutes the liquid crystal panel. In FIG. 20, symbol IC2A represents the mounting position of the drain driver IC2.

As shown in FIG. 20, the drain line DL is extended to the end portion of the lower substrate SUB1 of the liquid crystal panel PLN below the mounting position ICA2 (below the body of the IC) of the drain driver IC2 and is connected to a short-circuit line (common line) ST that is required for the production process and is formed at the substrate portion thereafter to be cut and removed. When the short-circuit line is cut at the time of cutting and removal of the lower substrate SUB1 during the production process of the liquid crystal panel, the drain line DL is separated into individual lines.

In the production process of the liquid crystal panel PNL, performance of thin film transistors is likely to fluctuate due to static electricity, thereby inviting the occurrence of image quality defects. To prevent this problem, a short-circuit line (common line) ST for short-circuiting each drain line is formed at the cut-off portion of the lower substrate SUB1 as shown in FIG. 17A. In the conventional liquid crystal panels, this short-circuit line (common line) is disposed at the chip mounting portion of the drain driver (below the body of the chip), and is cut off by means such as laser immediately before the chip is mounted.

In this embodiment, the input terminal bumps are not formed on the side close to the end face of the lower substrate SUB1. Therefore, the drain line DL is connected to the short-circuit line (common line) ST that is extended below the body of the chip and is disposed at the position to be finally cut and removed.

Incidentally, the system using TCP originally includes the drain lines and the short-circuit lines (common lines) formed as shown in FIG. 20. When it is mounted to FCA, however, each output line cannot be extended to the end side of the lower substrate SUB1 because the input terminal bumps are obstacles. Therefore, cutting by means of laser, or the like, described above has been indispensable in the past.

The construction according to this embodiment eliminates the necessity for cutting the short-circuit line (common line) by laser, etc, and can reduce the number of the production steps and the production cost.

Figure 21:
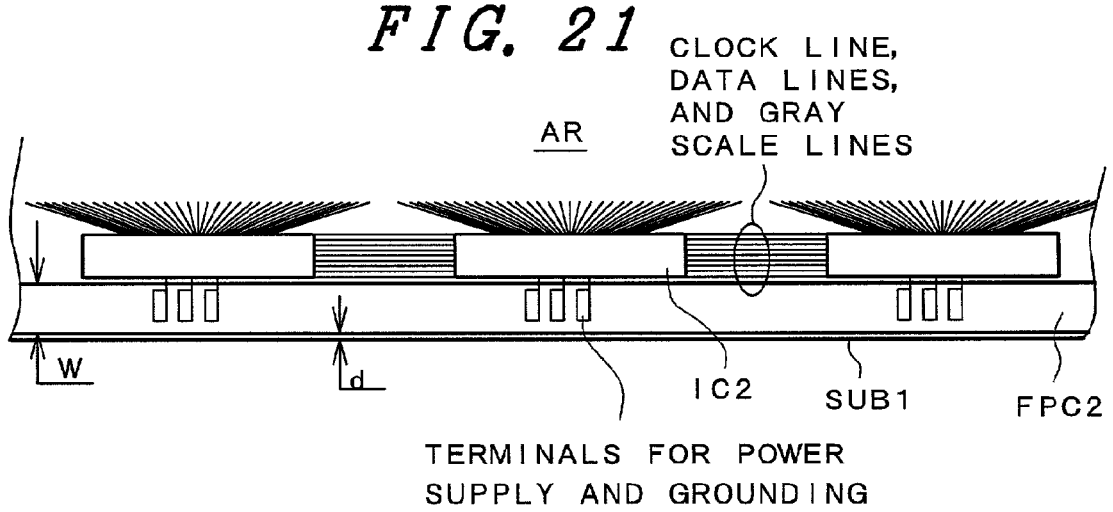
FIG. 21 is a plan view of the principal portions of a liquid crystal panel and is useful for explaining schematically a liquid crystal display device according to the thirteenth embodiment of the present invention.

FIG. 21 is a plan view of the principal portions of the liquid crystal panel and is useful for explaining typically the fifteenth embodiment of the present invention. The display region AR occupies substantially the whole area of the lower substrate (glass substrate) constituting the liquid crystal panel. A terminal line to which the drain driver IC2 is mounted is formed at the outer edge of the lower side.

As shown in FIG. 21, the lines for the pixel clocks, the display data and the gray scale voltages that connect the drain drivers 2 with one another are formed on the lower substrate SUB1 of the liquid crystal panel. The power supply and grounding (GND) terminals to each drain driver IC2 protrude by a distance d from the mounting position of the drain driver IC2 in a direction crossing at right angles the edge of the lower substrate SUB1.

FPC in this embodiment has power supply lines and grounding lines at the power supply and grounding (GND) terminals. The width W falls within the gap between the edge of the lower substrate SUB1 and the mounting position of the drain driver IC2. The portion other than the connection portion with the external printed substrate (the portion adjacent to the gate FPC) has the width that need not be bent to the back of the liquid crystal panel, and has substantially the same width as the compression-bonding portion to the lower substrate SUB1.

The lines for the pixel clock, the display data and the gray scale voltage and the power supply and grounding (GND) lines are formed on the conventional FPC, and the portions swelling from the liquid crystal panel are bent and stored to the back of the liquid crystal panel.

In the flexible printed substrate FPC2 according to this embodiment, only the power supply lines (inclusive of the grounding lines) are formed, and the size may be the one shown in the drawing. In addition, since multi-layered wiring is not necessary, the production cost can be lowered.

The flexible printed substrate FPC2 can have a simple construction as the wiring is formed on the back of the compression-bonded portion to the lower substrate SUB 1.

Figure 22:
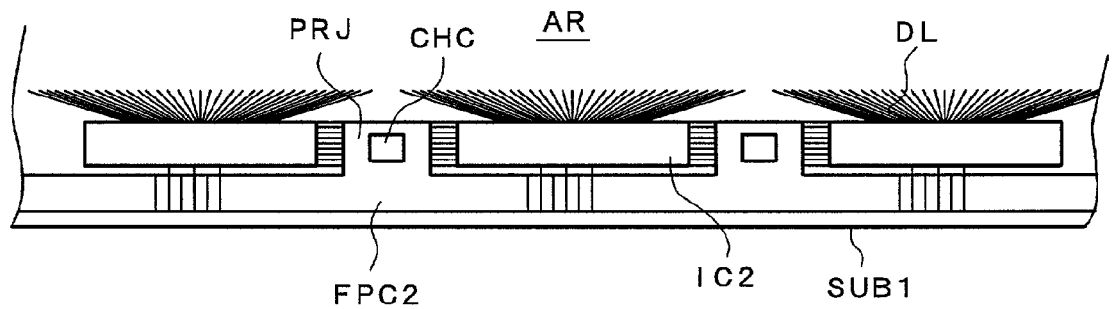
FIG. 22 is a plan view of the principal portions of a liquid crystal panel and is useful for explaining schematically a liquid crystal display device according to the fourteenth embodiment of the present invention in the same way as in FIG. 21.

FIG. 22 is a plan view of the principal portions of the liquid crystal panel and is useful for typically explaining the sixteenth embodiment in the same way as FIG. 21. A part of FPC on the drain driver side, that is, a projection portion PRJ that can be formed in the gap of the drain drivers IC2 in the arrangement direction, is formed in this embodiment so that electronic components such as chip capacitors CHC can be mounted to this projection portion.

This embodiment can sufficiently secure the mounting space of the electronic components and makes it easy to mount the electronic components.

Figure 23:
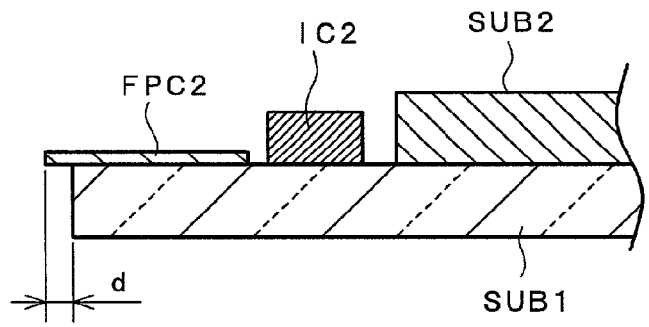
FIG. 23 is a sectional view of the principal portions of a liquid crystal panel and is useful for explaining schematically a liquid crystal display panel according to the fourteenth embodiment of the present invention.

FIG. 23 is a plan view of the principal portions of the liquid crystal panel and is useful for explaining typically the seventeenth embodiment of the present invention.

In this embodiment, the flexible printed substrate FPC2 shown in FIG. 21 or 22 is allowed to slightly (by a distance d) protrude outside from the edge of the lower substrate SUB1. Static electricity jumps in many cases into the lines on the lower substrate SUB1 during the production process of the liquid crystal panel. Static electricity is likely to invade particularly when the edge portion of the liquid crystal panel comes into contact with a conveying device used during the production process, such as a cassette or a tray.

Figure 27:
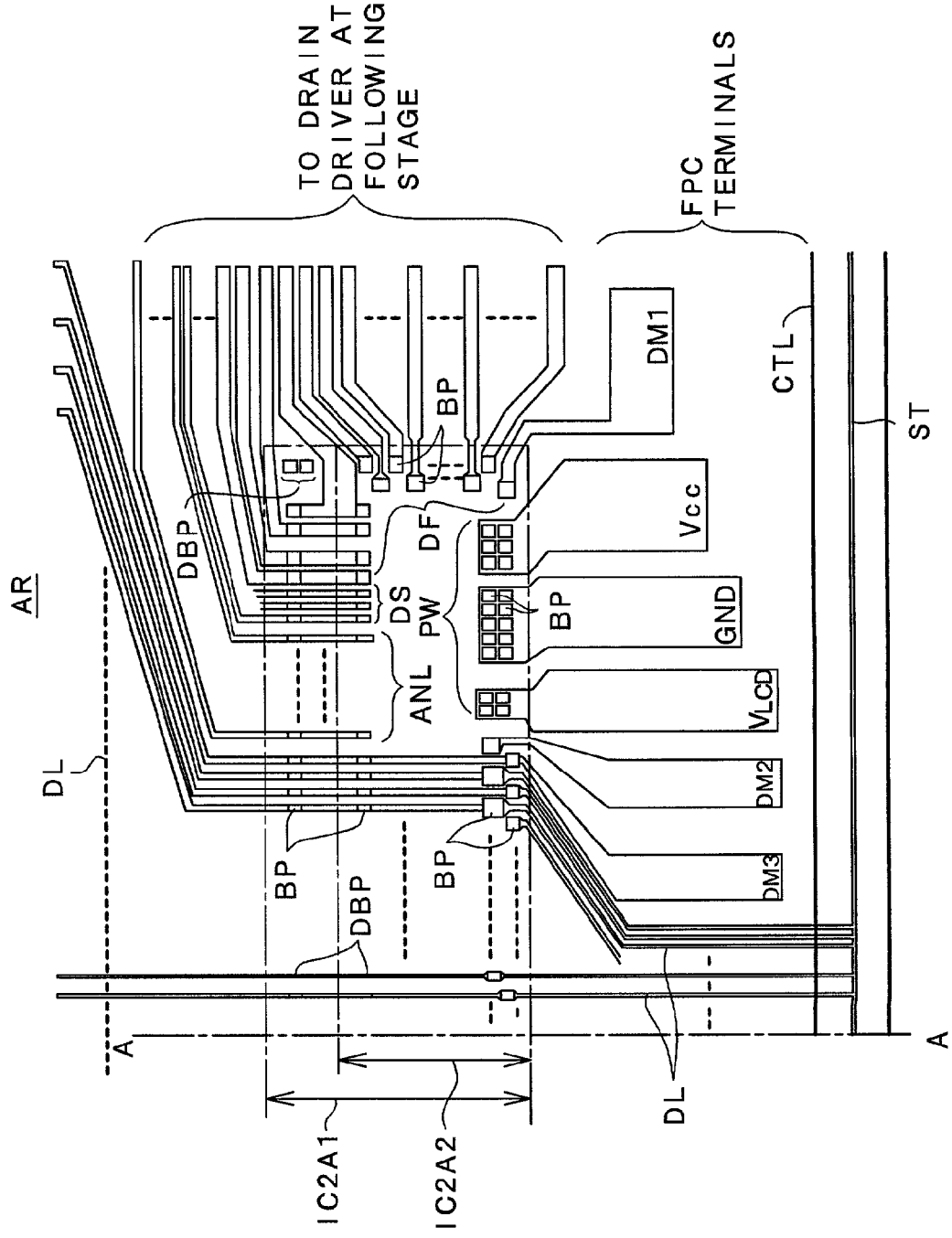
FIG. 27 is a schematic plan view showing in enlargement a half of a mounting portion of a drain driver on the output side.

The construction of this embodiment can prevent the edge portion of the liquid crystal panel, particularly the lower substrate having the TFT formed thereon, from coming into contact with the external conveying devices. Therefore, damage of the TFTs due to static electricity particularly when the drain line DL extends to the edge of the lower substrate SUB1 as shown in FIG. 27, can be avoided. This protruding width d can be set arbitrarily in accordance with the size and the thickness of the liquid crystal panel or the flexible printed substrate FPC.

In FIG. 23, invasion of static electricity can be checked more effectively when the grounding lines are disposed on the outermost side among the lines formed on the flexible printed substrate FPC.

Figure 24:
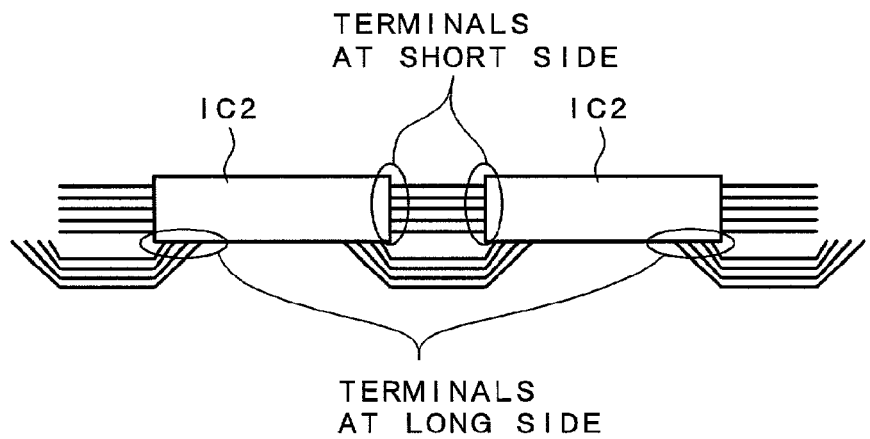
FIG. 24 is a sectional view of the principal portions of a liquid crystal panel and is useful for explaining schematically a liquid crystal display device according to the fifteenth embodiment of the present invention.
Figure 25:
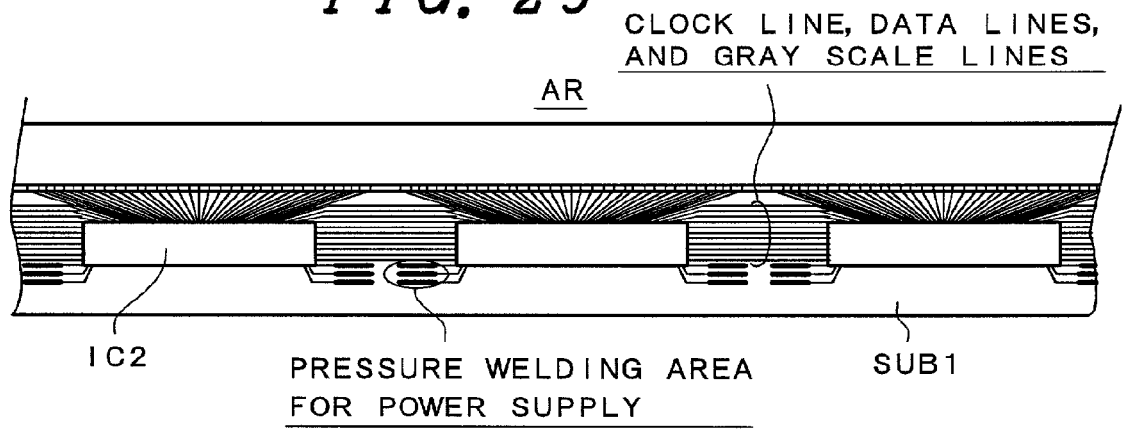
FIG. 25 is a sectional view of the principal portions of a liquid crystal panel and is useful for explaining schematically a liquid crystal display device according to the sixteenth embodiment of the present invention.

FIG. 24 is a plan view of the principal portions of the liquid crystal panel and is useful for explaining typically the eighteenth embodiment of the present invention. Incidentally, the substrate positioned below is omitted from the drawing.

In this embodiment, the lines for the series supply system of the display data and the pixel clocks among the drain drivers are directly formed on the lower substrate SUB1 and are extended from a part of each of the major and minor sides of the drain driver IC2 chip. This construction can provide a margin to the gap between the lines and increase a wiring density. Therefore, this embodiment can reduce the production cost.

FIG. 27 is a plan view of the principal portions of the liquid crystal panel and is useful for explaining typically the nineteenth embodiment of the present invention. In this embodiment, the display data lines, the pixel clock lines and the gray scale voltage lines for connecting the drain drivers IC2 with one another are connected on the minor side of the drain driver IC2, and the power source lines are formed in such a fashion as to extend from the portion of the major side of the drain driver IC2 adjacent to the minor side in a direction substantially parallel to the extending direction of the display data lines, the pixel clock lines and the gray scale voltage lines.

The formation portion (inclusive of the connection portion with the flexible printed substrate FPC2) of the power source lines (inclusive of the grounding lines) is positioned at the compression-bonding portion of the flexible printed substrate FPC2. In this instance, the lines on the minor side of the drain driver IC2 are formed close to the effective display region AR of the liquid crystal panel so that the connection portion between the power supply lines and the flexible printed substrate FPC2 can be recessed back from the edge of the lower substrate SUB1 and the frame can be further reduced.

Figure 26:
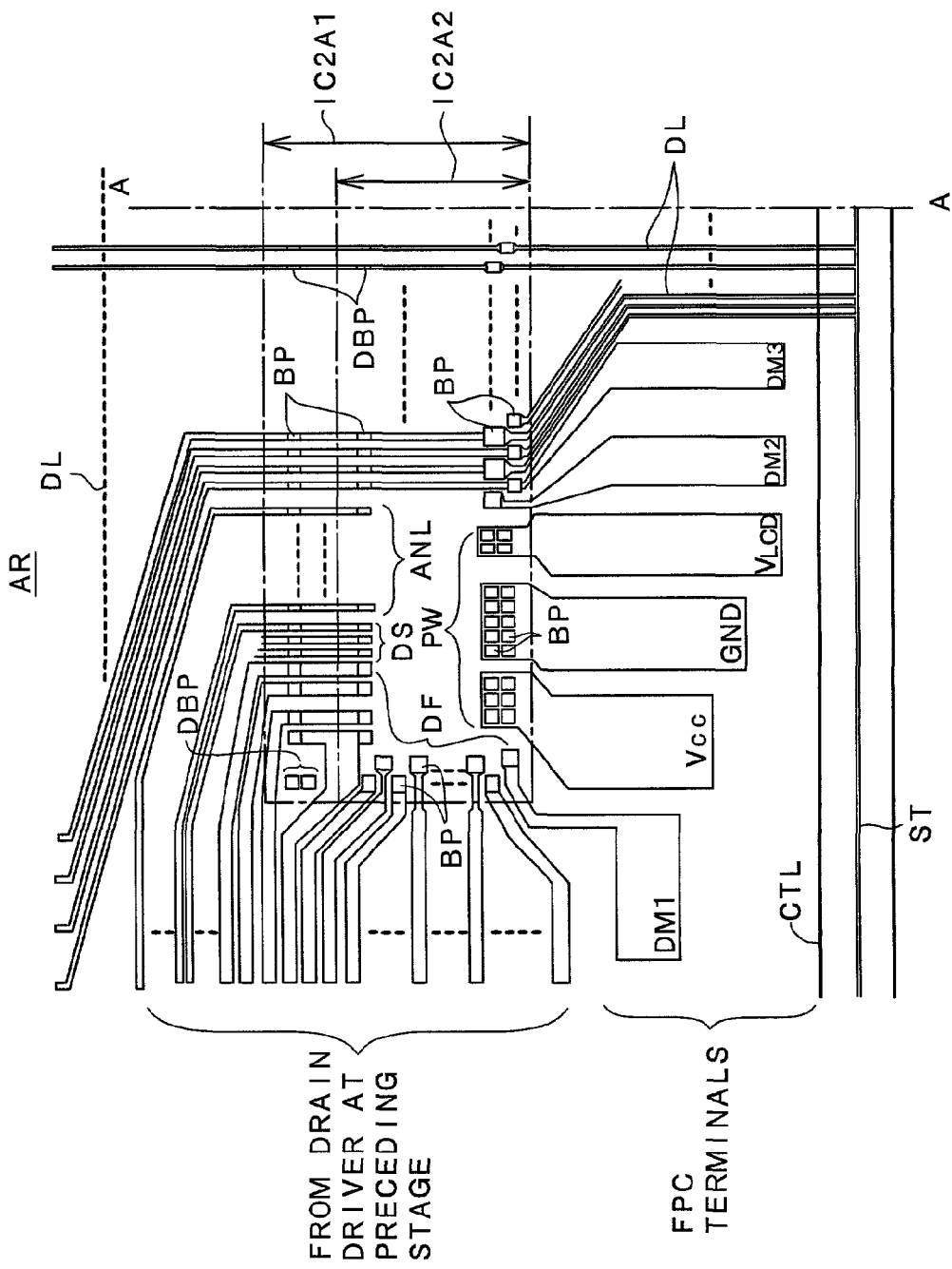
FIG. 26 is a schematic plan view showing in enlargement a half of a mounting portion of a drain driver on the input side.

FIGS. 26 and 27 are schematic plan views showing in enlargement the mounting portions of the drain drivers, wherein FIG. 26 shows the half of the drain drivers on the input side and FIG. 27 does the half on the output side.

In FIGS. 26 and 27, IC2A1 represents the mounting positions of the drain drivers IC2 having a size specification 1 and IC2A2 does the mounting positions of the drain drivers IC2 having a size specification 2. The drain driver IC2A1 having the size specification 1 is different from the drain driver IC2A2 having the size specification 2 in the size of their minor sides. In the explanation that follows, the portions of the drain drivers having the size specification 1 and the size specification 2 that are not relevant to the mounting position will be explained as IC2A. The terminal and bump arrangements of the drain drivers on the output side are symmetric with the input side. Therefore, the explanation will be given mainly on the input side.

The lines and input bumps for each display data, each clock signal and each gray scale voltage signal transferred from a drain driver of a preceding stage are arranged on the major side of each drain driver IC2 in the proximity of the minor side of the preceding stage drain driver and the minor side of the display area AR side. Symbol ANL represents the gray scale voltage signal line for the analog signal, and its bump is disposed on the major side in the proximity of the minor side on the display area AR side. Since the analog wiring may have a high resistance to a certain extent, it is disposed on the major side by reducing its width.

The lines DF for the display data signal as the high-speed digital signal and the pixel clock signals CL2 must have a low resistance. Therefore, they are disposed at a part of the major side in the proximity of the minor side of the preceding stage drain driver and the minor side on the display area side AR. The lines DS for the low-speed digital signals such as the frame clock signal CL1 and the inversion signal M are interposed between the gray scale voltage line ANL and the high speed digital signal line DF on the major side in the proximity of the minor side on the display area AR side.

The bumps BP of the drain lines DL as the output lines of the drain driver are naturally disposed on the substrate outer edge side as the substrate cutting line side of the drain driver, and the drain lines DL extend, and are wired, through the bumps BP to the common lines ST the drain lines DL form on the display area AR side and outside the substrate cutting line (the portion to be cut and removed).

The bumps BP formed on the minor side input side of the drain driver are arranged zigzag. At the same time, the terminals BP of the drain lines DL, too, are arranged zigzag. These bumps of the zigzag arrangement are similarly disposed on the half of the drain driver output side as shown in FIG. 27. The bumps BP formed on the input side minor side are arranged at the positions reached by moving parallel the bumps on the output side minor side.

Figure 28:
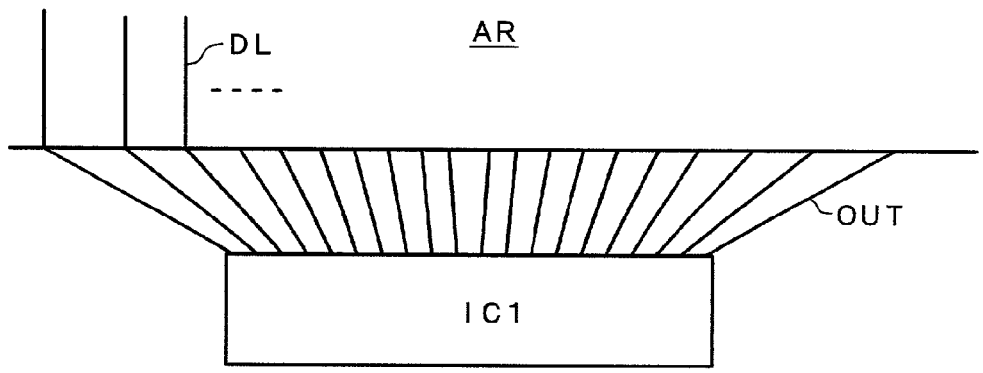
FIG. 28 is an explanatory view of output lines of a drain driver according to the prior art.

As shown in FIG. 28, the output lines OUT of the drain driver IC2 are connected obliquely to the corresponding drain lines DL of the pixel area AR. Therefore, the wiring length greatly varies depending on the positions, and the difference occurs in the resistance values of the oblique connection portions. When the difference of the resistance values reaches a certain value, it results in the difference of dullness of the drain waveforms and invites eventual display non-uniformity.

Prior art technologies increase (broaden) the thickness (width) of the oblique lines at the portions where the oblique lines are long (at both end portions of the drain driver chip) and decrease (narrow) the thickness (width) at the portions where the lines are short (at the center of the drain driver chip) so as to adjust the resistance value to a constant value.

When the number of outputs per drain driver chip is increased, however, the difference of the resistance values of the oblique lines becomes so great that it cannot be adjusted any longer. The present invention employs the following construction to cope with this problem.

Figure 29:
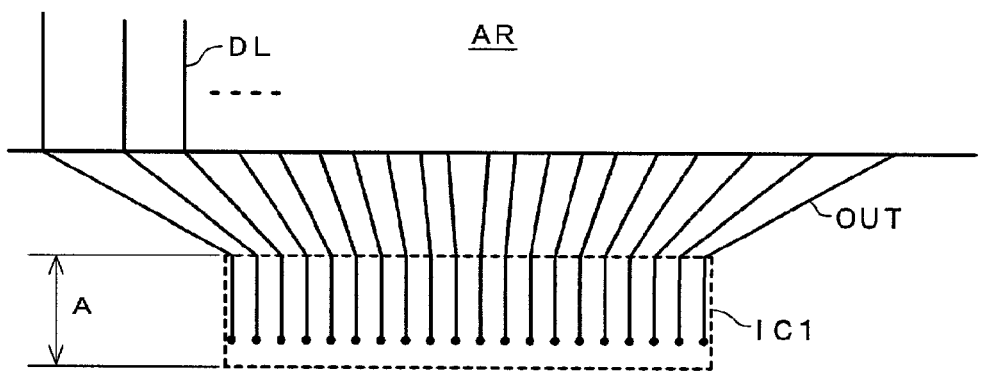
FIG. 29 is an explanatory view of a structure of output lines of a drain driver and is useful for explaining a liquid crystal display device according to the twelfth embodiment of the present invention.

FIG. 29 is an explanatory view of the output wiring construction of the drain driver and is useful for explaining the liquid crystal display device according to the twentieth embodiment of the present invention. The output lines OUT are disposed on the side far from the display area (pixel area) AR of the drain driver IC1. In other words, output lines OUT extended obliquely from the display area (pixel area) are further extended to the side far from the pixel area AR below the body of the drain driver IC1.

When this wiring method is employed, the difference of the resistance values can be adjusted in the wiring area represented by A in FIG. 29, too, and freedom for adjusting the resistance values to a constant value can be improved. When the terminals of the lines are arranged zigzag as represented by black circles in FIG. 29, the connection margin with the bumps of the drain driver IC1 can be increased. The common line to cope with static electricity is disposed outside the substrate cutting line, and the output lines OUT are extended and connected to the common lines. In this way, the cutting step of the common lines and the output lines by laser can be omitted.

Power supply terminals are disposed on the major side of the outer side of the drain driver substrate in the proximity of its minor side. These power supply terminals VCC, GND, VCLD are shaped into a step-like shape as shown in the drawing. Incidentally, DM1, DM2 and DM3 represent dummy terminals and DPB does dummy bumps.

The bumps of the power supply terminals VCC, GND and VLCD to be formed on the drain driver side are disposed in two rows along the major side to reduce the connection resistance.

To cope with the drain drivers having different size specifications, the terminal BP of each line of the drain driver on the major side on the display area AR side is disposed at two positions in the direction along the minor side of the drain driver.

As shown in FIGS. 26 and 27, the width of the line for each of the high-speed digital signal, the low-speed digital signal and the analog signal is changed so that the resistance value falls within an allowable range. The high-speed lines for the display data are disposed with a predetermined gap. The lines for the low-speed digital signals have the same resistance as that of the lines for the high-speed digital signals.

The bumps to be provided to the high-speed signal lines, the low-speed digital signal lines and the analog signal lines have different sizes to correspond to the line width.

The drain lines DL are extended outside the substrate of the drain driver and are connected to the common lines ST to cope with static electricity. Therefore, when the substrate is cut and removed along the cutting line CTL, each drain line is individually separated, and the cutting step of the prior art using the laser beam, etc, is not necessary. Wiring of the drain lines DL outside the substrate need not always cross orthogonally the outer edge of the substrate but may be oblique wiring, too.

As described above, the bumps BP corresponding to the drain drivers of the two size specifications are formed on the major side on the display area side of the mounting position of the drain driver. Therefore, the drain drivers of the two size specifications can be used in common. Generally speaking, miniaturization of the drain drivers of this kind depends on the reduction of the size of the minor side. According to the construction of this embodiment, the drain driver of the size specification IC1A1 and the drain driver of the size specification IC1A2 can be applied without changing the wiring pattern on the substrate side.

Figure 30:
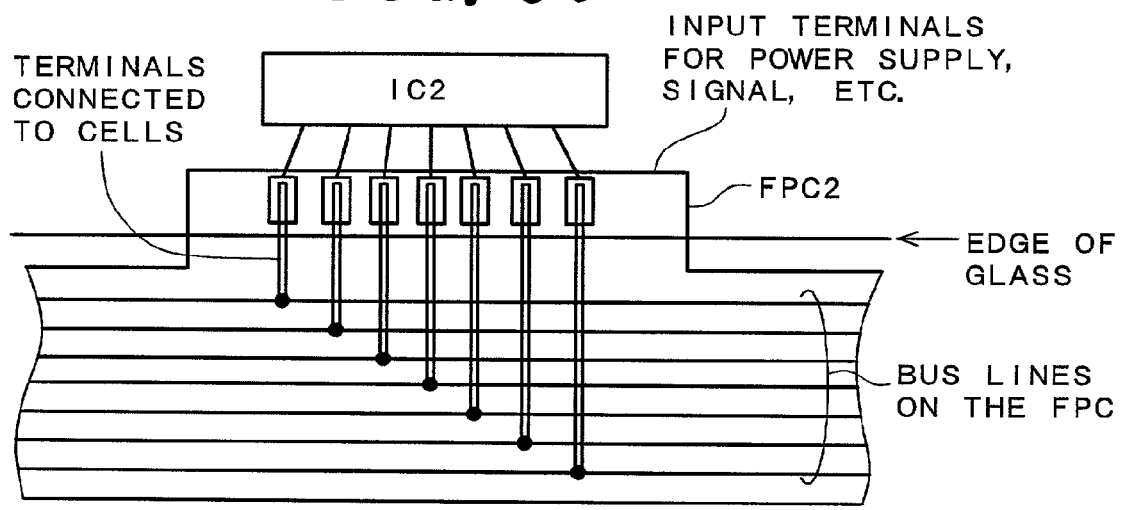
FIG. 30 is an explanatory view of a conventional connection of a drain driver and FPC lines.

FIG. 30 is an explanatory view of the conventional connection structure of wiring of the drain drivers and the flexible printed substrate. Conventionally, connection of the drain driver IC2 and the flexible printed substrate FPC2 has been achieved by extending the terminals of the flexible printed substrate FPC2 to portions outside the glass (substrate) edge and connecting them to the bus lines of the flexible printed substrate FPC2 by means of through-holes as shown in FIG. 30. In this case, the portions that are thermally compression-bonded in ACF are only the terminals. Therefore, the flexible printed substrate FPC2 has only the same width as that of the compression-bonding portion. Moreover, the same portion is used for the bus line, and all of the through-holes and the bus lines exist in the region to be thermally compression-bonded.

When the through-holes are thermally compression-bonded, their connection reliability might be affected adversely. Therefore, the present invention employs the following counter-measure.

Figure 31:
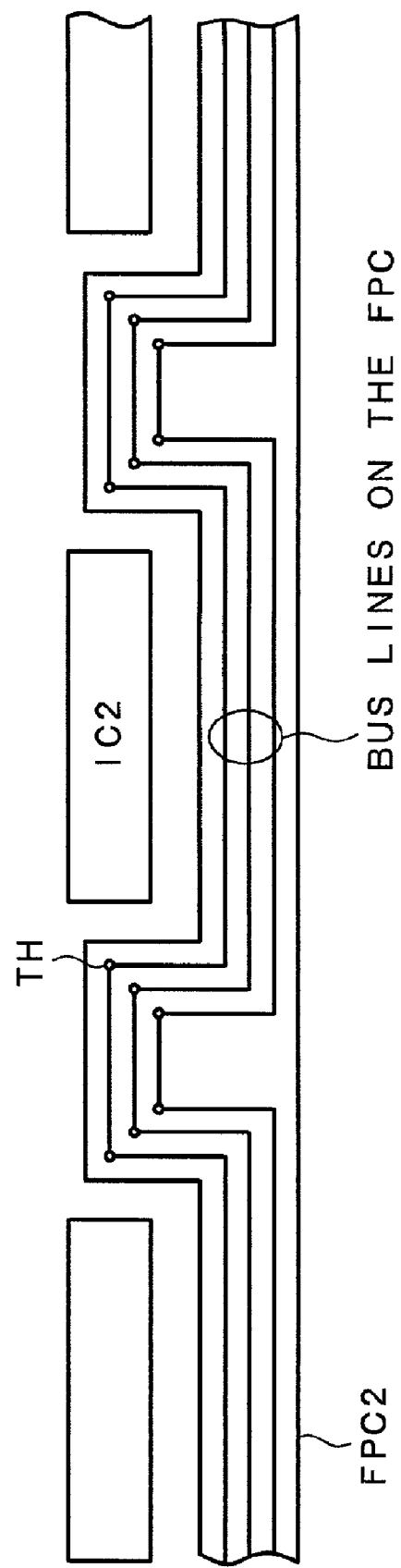
FIG. 31 is an explanatory view of a connection structure of a drain driver and FPC lines and is useful for explaining schematically the twenty-first embodiment of the present invention.

FIG. 31 is an explanatory view of the connection structure of the drain driver and the flexible printed substrate and is useful for typically explaining the twenty-first embodiment of the present invention. As shown in the drawing, a part of the flexible printed substrate FPC2 is allowed to protrude between the adjacent drain drivers IC2, and through-holes TH are positioned in this protruding portion (corresponding to PRJ in FIG. 22). The component CHC such as the chip capacitor is mounted to the protruding portion (see FIGS. 2 and 22). According to this construction, the through-holes TH are out of the thermal compression-bonding region, and the adverse influences on connection reliability in the conventional construction described above can be avoided.

Figure 32:
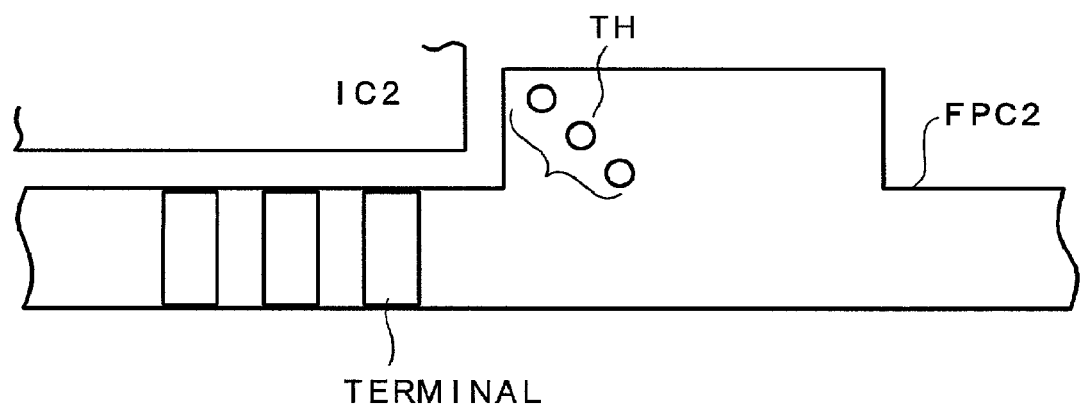
FIG. 32 is an explanatory view of a connection structure of a drain driver and FPC lines and is useful for further explaining the twenty-first embodiment of the present invention.

Since the bus lines of the flexible printed substrate FPC2 are formed in the same layer as shown in FIG. 32, however, the terminals of the flexible printed substrate FPC2 and the through-holes TH cannot be connected when the construction shown in FIG. 31 is used as such. Therefore, the present invention employs the following counter-measure.

Figure 33:
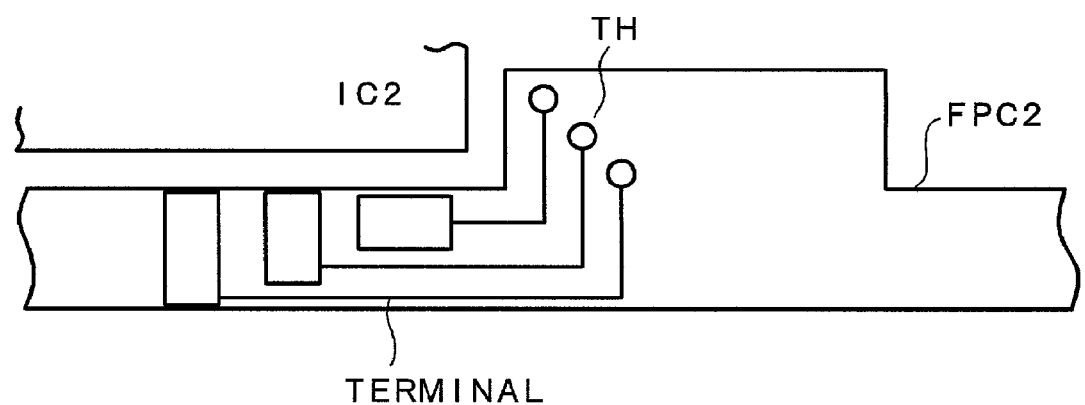
FIG. 33 is an explanatory view of a connection structure of a drain driver and FPC lines and is useful for further explaining the twenty-first embodiment of the present invention shown in FIG. 31.

FIG. 33 is an explanatory view of the connection structure of the drain drivers and the flexible printed substrate FPC2 and is useful for further explaining the twenty-first embodiment of the present invention shown in FIG. 31. In this embodiment, the terminals of the flexible printed substrate FPC are shaped into a step form so that the terminals and the through-holes can be connected to one another. Incidentally, each signal line can be formed in the same layer as the gate line or the drain line.

Figure 34:
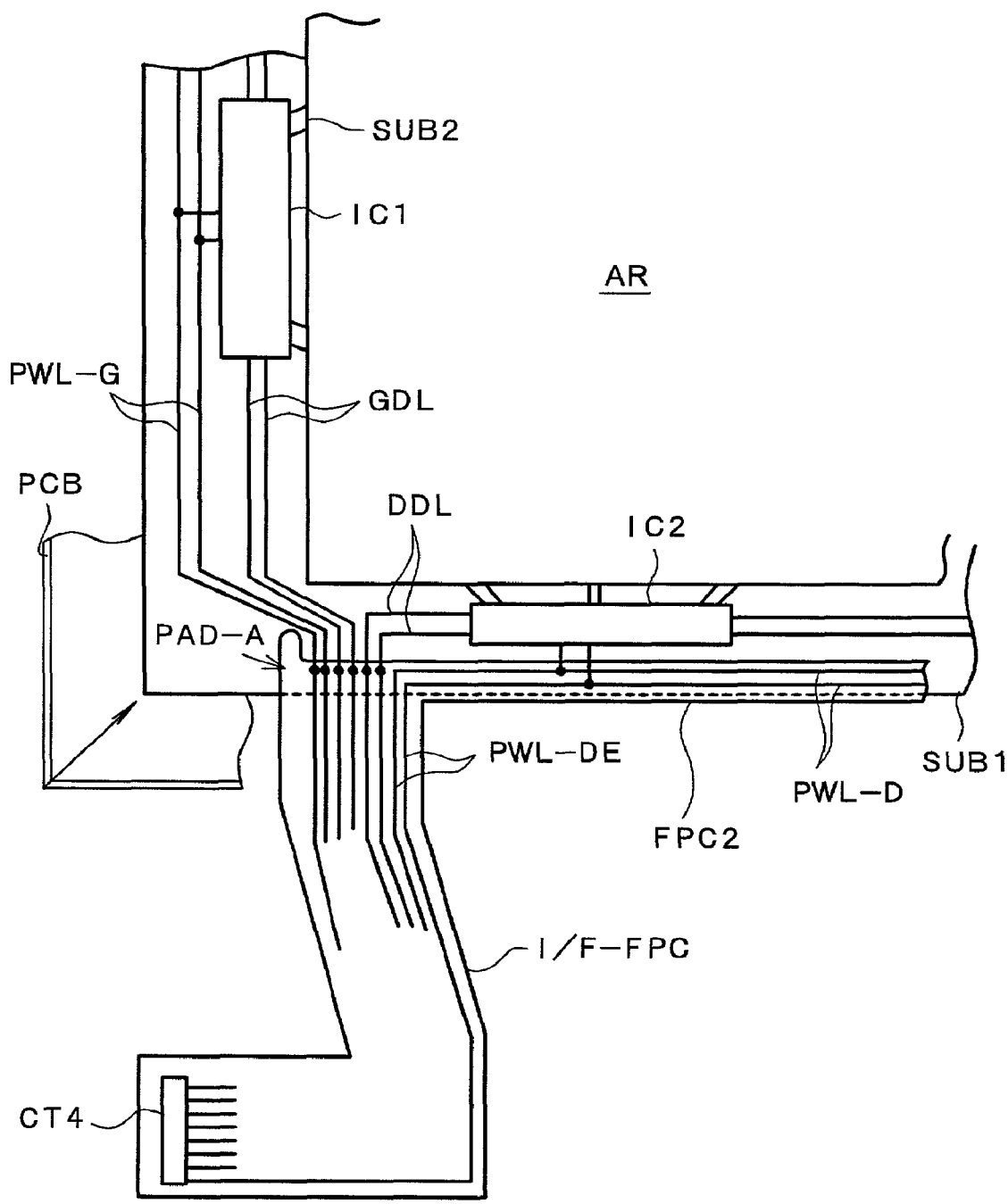
FIG. 34 is a structural view of the principal portions around lines of a lower substrate and a flexible printed substrate and is useful for explaining the twenty-second embodiment of the present invention.

FIG. 34 is a structural view of the principal portions of the wiring of the lower substrate and the flexible printed substrate and is useful for explaining the twenty-second embodiment of the present invention. In FIG. 34, the drain driver IC2 is mounted to the lower side (on the drain driver side) of the lower substrate SUB1 constituting the liquid crystal panel and the gate driver IC1, to the left side (on the gate driver side), by FCA mounting, respectively.

Drain data lines for serially transferring in series the data signals (display data, gray scale voltage signals) and various high- and low-speed clock signals inclusive of the pixel clock signals between the drain drivers are directly formed on the lower side of the lower substrate SUB1.

Gate data lines and gate driver power supply lines for serially transferring in series the scanning voltage signals and the scanning clock signals are directly formed on the left side of the lower substrate.

The flexible printed substrate FPC2 is disposed in the periphery of the lower substrate SUB1 at which the drain driver IC2 is arranged. This flexible printed substrate includes (1) a drain driver power supply wiring section at which drain driver power supply lines PWL-D extending along the periphery of the lower substrate SUB1 (on the drain driver IC2 side) are formed only, and (2) an interface wiring section I/F-FPC at which extended portions PWL-DE of the drain driver power supply lines, drain data connecting lines connected to the drain data lines DDL, gate data connecting lines connected to the gate data lines GDL, and gate driver power supply connecting lines connected to the gate driver power supply lines PWL-G are formed. The interface wiring section I/F-FPC is disposed at an end of the drain driver power line section (corresponding to a side of the lower substrate SUB1 at which the gate driver IC1 is disposed). In FIG. 34, the drain driver power supply wiring section of the flexible printed substrate FPC2 is shown as a section of the flexible printed substrate FPC2 other than the interface wiring section I/F-FPC thereof. Although a drain driver power supply wiring section has only drain driver power supply lines PWL-D formed thereat in FIG. 34, any wiring lines other than the drain driver power supply lines may be formed thereat also. While the wiring lines other than the drain driver power supply lines may be formed on the aforementioned drain driver power supply wiring section of the flexible printed substrate FPC2 not only in the example of FIG. 34 but also in any variations of this example which will be mentioned hereinafter, it is preferable to dispose the drain driver power supply lines PWL-D on the drain driver power supply wiring section of the flexible printed substrate FPC2 and the drain data lines DDL on the periphery of the substrate SUB1 extending along the drain driver power supply wiring section, respectively. In other words, the drain driver power supply lines PWL-D and the drain data lines DDL should be spaced from one another.

The interface wiring section I/F/FPC of the flexible printed substrate FPC2 is folded to the back of the liquid crystal panel, and the connector CT4 disposed at the distal end is coupled with a connector (not shown) provided to the interface printed substrate PCB.

Incidentally, the interface printed substrate PCB is disposed on the back of the liquid crystal panel at the mounting position of the gate driver IC1. The lines on the lower substrate SUB1 (drain data lines, gate data lines and gate power supply lines) and the connection lines of the flexible printed substrate are compression-bonded by the pad PAD-A represented by black circles (arrow A) in the drawing to establish electric connection.

According to this embodiment, the data lines and the power supply lines are directly formed on the lower substrate SUB1 on the gate driver side where a greater space margin can be secured than on the drain driver side, and the flexible printed substrate is disposed on only the drain driver side.

Since only the drain power supply lines are formed on the flexible printed substrate FPC2 disposed on the drain driver side, the flexible printed substrate may be single-layered wiring, and wiring of its interface wiring section I/F/FPC may be single-layered wiring, too.

As a result, this embodiment can reduce the number of flexible printed substrates and can simplify the construction of the flexible printed substrate itself. Therefore, this embodiment can reduce the number of necessary components and can reduce the cost.

Figure 35:
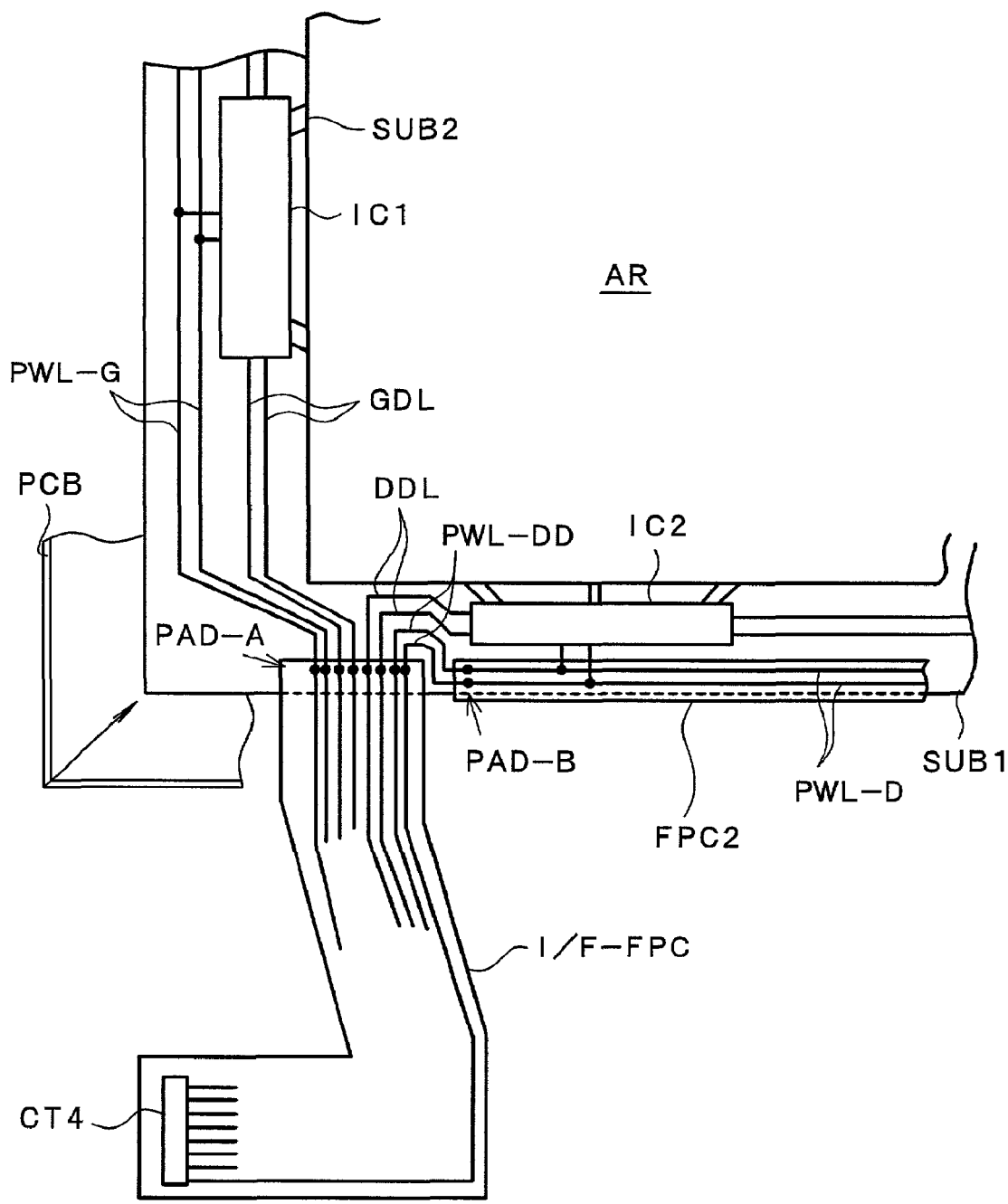
FIG. 35 is a structural view of the principal portions around lines of a lower substrate and a flexible printed substrate and is useful for explaining the twenty-third embodiment of the present invention.

FIG. 35 is a structural view of the principal portions of the lines of the lower substrate and the flexible printed substrate and is useful for explaining the twenty-third embodiment of the present invention. In this embodiment, the interface wiring section I/F/FPC is separated from the flexible printed substrate FPC2 in the embodiment shown in FIG. 34 and is fitted near the drain driver mounting side on the end portion side where the gate driver IC1 is disposed.

The flexible printed substrate FPC2 has a shape of a rectangle extending along the drain driver of the liquid crystal panel, and only the drain driver power source lines PWL-D are formed into two-layered wiring. The drain driver power supply connecting lines PWL-DD that connect the drain driver power supply lines PWL-D to the drain driver power supply lines formed on the interface wiring section I/F/FPC are directly formed on the lower substrate SUB1 as shown in FIG. 35.

The data lines DDL on the drain driver side, the data lines GDL on the gate driver side and the gate driver power supply lines PWL-G are electrically connected by the pad PAD-B represented by black circles (arrow B) in FIG. 35.

One of the ends of each drain driver connecting line PWL-DD, the other end of which is connected to the drain driver power supply line PWL-D of the flexible printed substrate FPC2, and the drain driver power supply line formed on the interface wiring portion I/F/FPC are electrically connected by the pad PAD-A represented by black circles (arrow A) together with the data lines DDL on the drain driver side, the data lines GDL on the gate driver side and the gate driver power supply lines PWL-G. The rest of the construction is the same as that of the twenty-second embodiment shown in FIG. 34.

Since the flexible printed substrate FPC2 has a rectangular shape in this embodiment, efficiency of cutting out the flexible substrate from its raw material, or so-called "trimming efficiency", can be improved, and the cost can be drastically reduced. The rest of the construction and effect are the same as those of the twenty-second embodiment.

Figure 36:
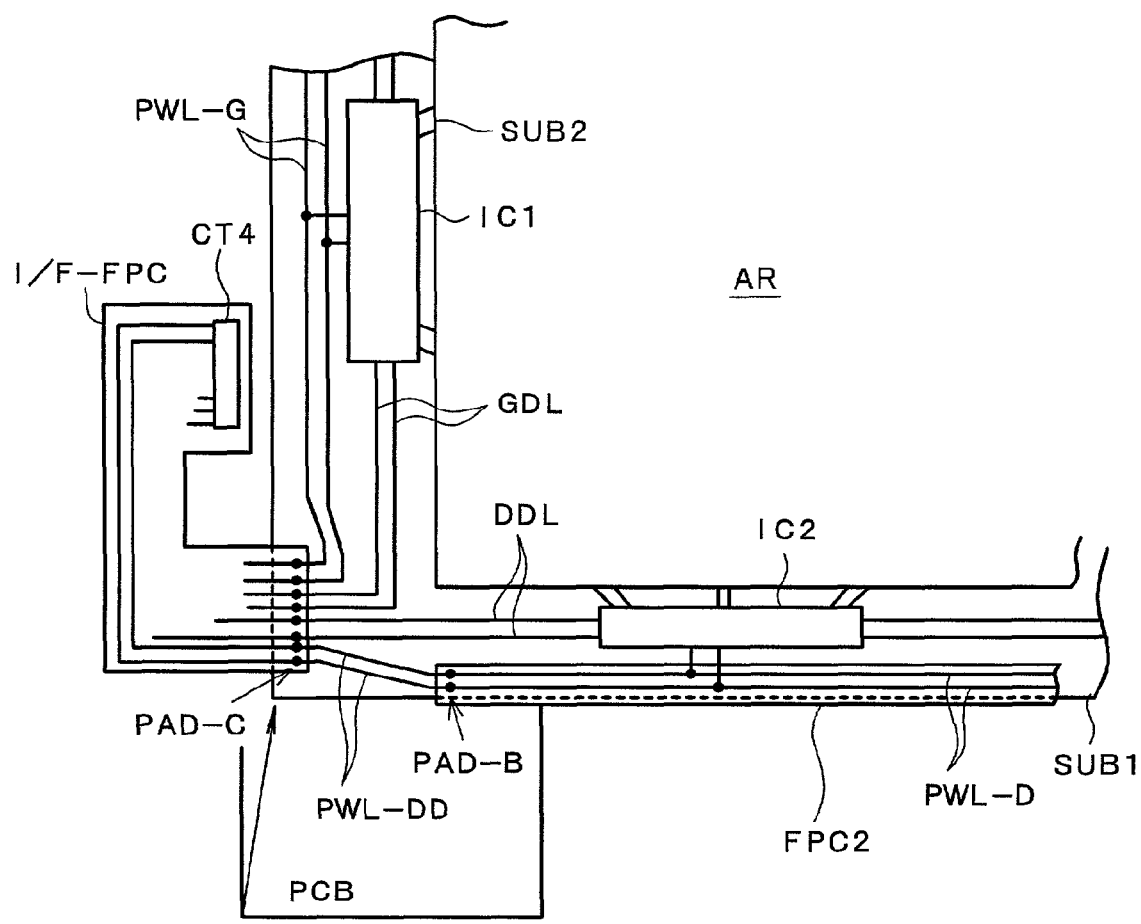
FIG. 36 is a structural view of the principal portions around lines of a lower substrate and a flexible printed substrate and is useful for explaining the twenty-fourth embodiment of the present invention.

FIG. 36 is a structural view of the principal portions of the lines of the lower substrate and the flexible printed substrate and is useful for explaining the twenty-fourth embodiment of the present invention. In this embodiment, the interface wiring section I/F/FPC in the twenty-third embodiment shown in FIG. 35 is fitted to the arrangement side of the gate driver IC1 of the liquid crystal panel.

Therefore, in FIG. 36, the drain driver power supply lines PWL-DD connecting the drain driver power supply lines PWL-D and the drain driver power supply lines formed on the interface wiring section I/F/FPC in FIG. 35 are so formed as to extend to the arrangement side of the gate driver IC1 having the interface wring section I/F/FPC fitted thereto. The other ends of the drain driver power supply connecting lines PWL-DD, the data lines DDL on the drain driver side, the data lines GDL on the gate driver side, the gate driver power supply lines PWL-G and the corresponding lines formed on the interface wiring section I/F/FPC are electrically connected by the pad PAD-C represented by arrow C (represented by black circles).

The effect of this embodiment is basically similar to that of the twenty-third embodiment described above. Since the fitting position of the interface wiring section I/F/FPC can be selected along the gate driver mounting side, the fitting position can be designed arbitrarily in accordance with the mounting space of other components such as TCON or with the positional relationship of the mounting components of the interface substrate PCB. Other effects are the same as those of the foregoing embodiments.

Figure 37:
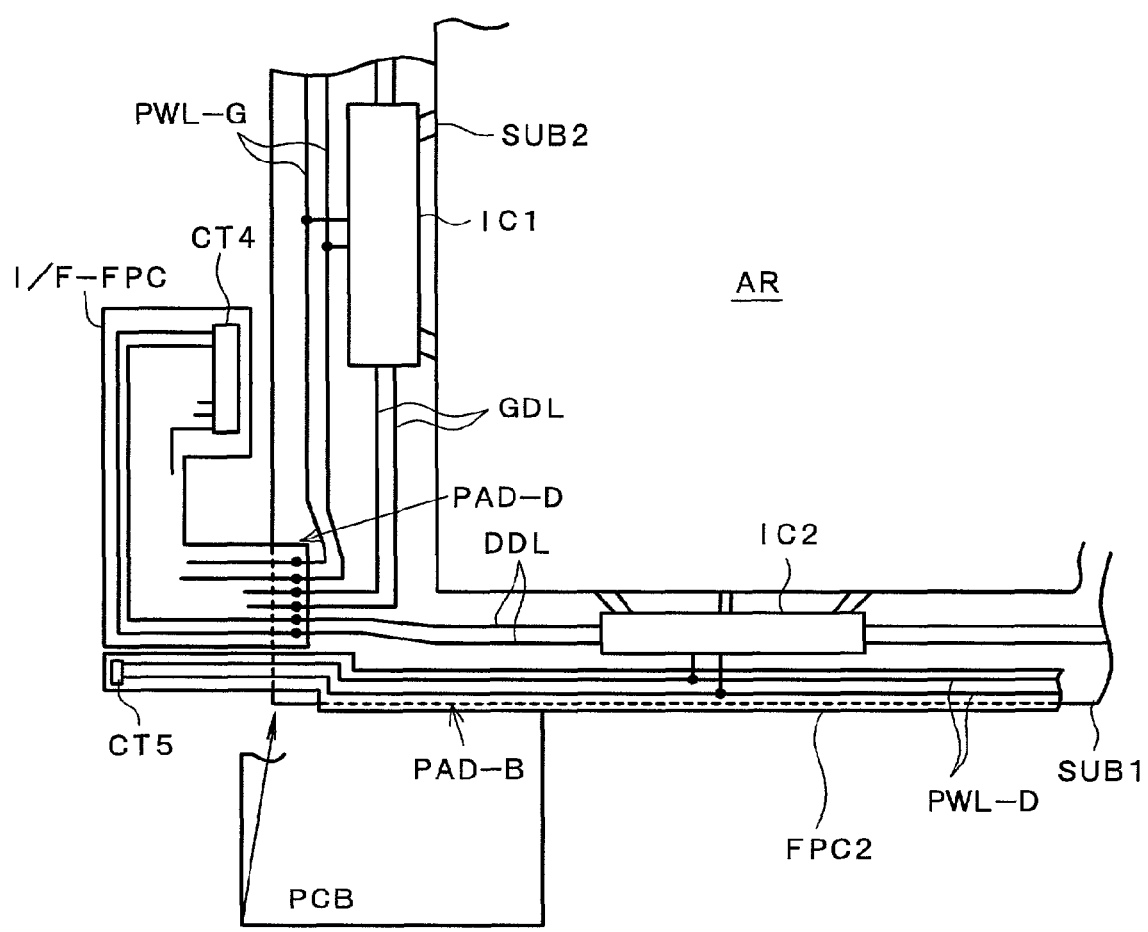
FIG. 37 is a structural view of the principal portions around lines of a lower substrate and a flexible printed substrate and is useful for explaining the twenty-fifth embodiment of the present invention.

FIG. 37 is a structural view of the principal portions of the lines of the lower substrate and the flexible printed substrate and is useful for explaining the twenty-fifth embodiment of the present invention. In this embodiment, the end portion (power supply end) of the flexible printed substrate FPC2 in the twenty-fourth embodiment shown in FIG. 36 is extended to the gate driver mounting side, and the connector CT5 for the drain driver power supply lines is provided to its distal end.

Therefore, the interface wiring section I/F/FPC disposed on the gate driver mounting side has the data lines for the drain drivers, the data lines for the gate drivers and their power supply lines in the same way as in the twenty-fourth embodiment. The lines of the interface wiring section I/F/FPC and the lines formed on the lower substrate SUB1 are electrically connected by the PAD-D represented by black circles.

In FIG. 37, the flexible printed substrate FPC2 has the step shape on the connector CT5 side. This arrangement is for allowing the outer edge of the flexible printed substrate FPC2 to protrude by the distance d from the lower substrate SUB1 and bringing the connector CT5 of the flexible printed substrate FPC2 into alignment with the connector position of the interface substrate PCB, not shown, by folding the protruding portion of the flexible printed substrate FPC2 to the back of the lower substrate SUB1. However, the shape may be a straight rectangle as a whole while the step is omitted.

This embodiment can improve material trimming efficiency of the flexible printed substrate FPC2 in the same way as in the twenty-third embodiment, and can reduce the number of process steps by gathering the connection pads to one position. Other effects are the same as those of the foregoing embodiments.

Next, another construction of the liquid crystal display device according to the present invention will be explained.

Figure 38:
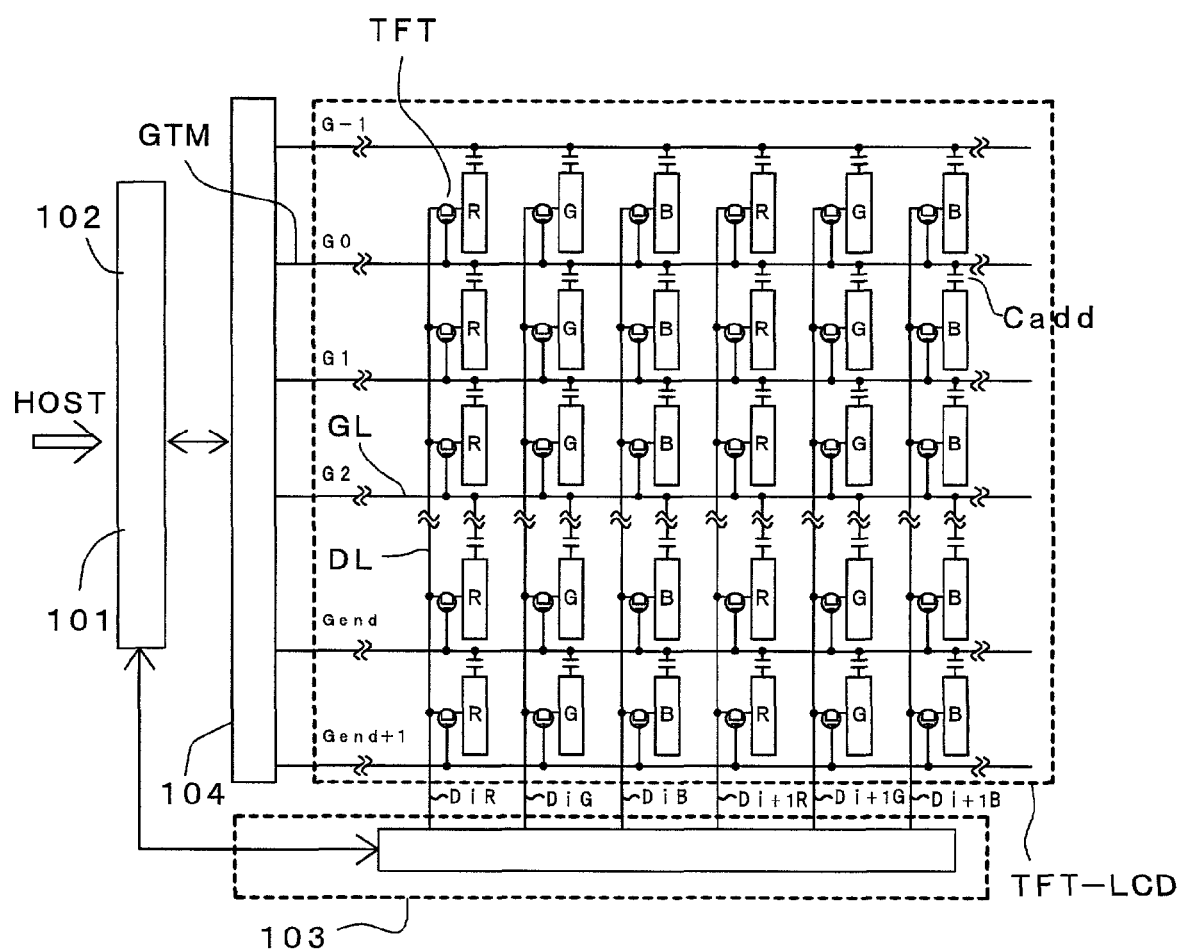
FIG. 38 is a block diagram showing an equivalent circuit of a liquid crystal display device.

FIG. 38 is a block diagram showing an equivalent circuit of the liquid crystal display device. In this liquid crystal display device, an image signal line driving circuit 103 is disposed below the liquid crystal panel (TFT-LCD) as the display unit, and a scanning signal line driving circuit 104, a controlling section 101 and a power supply section 102 are disposed on the side surface side.

The controller section 101 and the power supply section 102 are mounted to an interface substrate comprising a multi-layered printed substrate and are disposed on the back of the scanning signal line driving circuit 104 to reduce a frame region of a liquid crystal display module.

Each thin film transistors is disposed inside a crossing region of two gate signal lines GL adjacent to one another, and its drain electrode and gate electrode are connected to a drain line DL and a gate line GL, respectively. Symbol GTM represents gate line leading lines (G−1, G0, G1, G2, . . . , Gend, Gend+1), and symbols DiR, DiG, DiB, . . . , Di+1R, Di+1G, Di+1B represent the drain line leading lines. Symbol Cadd represents holding capacitance. Incidentally, the source and the drain are originally determined by a bias polarity between them. It is therefore to be understood that the source electrode and the drain electrode replace one another during the operation because the polarity inverses during the operation in the circuit of this liquid crystal display device.

Figure 39:
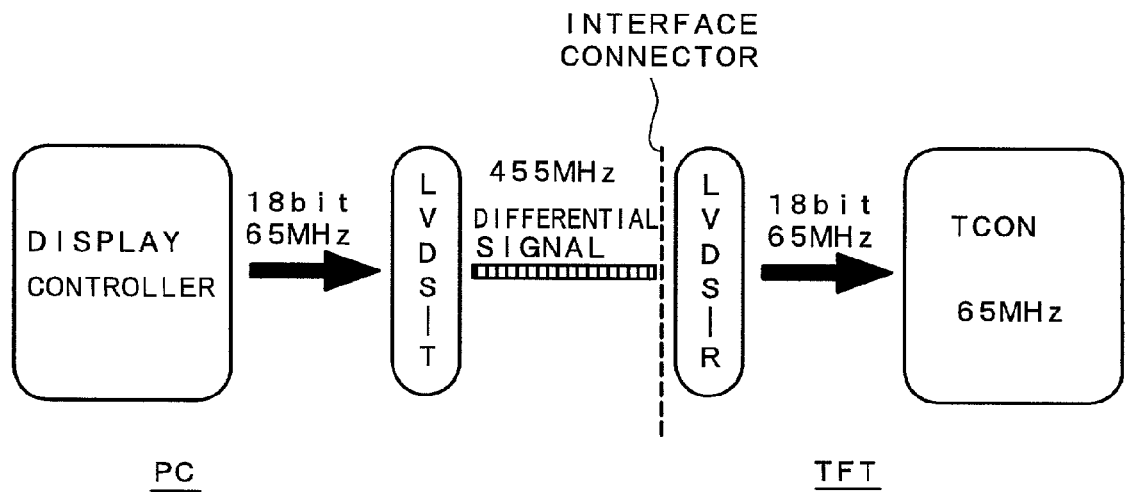
FIG. 39 is an explanatory view of the flow of display data between a host computer and a controller section of a liquid crystal display device.

FIG. 39 is an explanatory view of the flow of the display data between a host computer and the controller section of the liquid crystal display device. The display data (here, 18 bits, 65 MHz) outputted from a display controller of the host computer (represented by "PC") is inputted to a low voltage differential signal transmitter (transmitting LVDS: LVDS transmitter) LVDS-T on the transmission side, is converted to a low voltage differential signal (LVDS) and is then inputted to a low voltage differential signal receiver (receiving LVDS: LVDS receiver) LVDS-R of the liquid crystal display device (represented by "TFT") through an interface connector.

The LVDS receiver LVDS-R converts the input differential signal back to the original signal (18 bits, 65 MHz) and applies this signal to a timing controller TCON controlling the scanning signal line driving circuit and the image signal line driving circuit so that the liquid crystal display device can execute display.

The LVDS transmitter LVDS-T as the differential signal transmitter on the host computer side converts the digital data inputted in parallel to series digital data and transmits them to the liquid crystal display device. The LVDS receiver LVDS-R on the liquid crystal display device side converts the digital data inputted in series to the parallel digital data and reproduces the display signals. Therefore, the number of terminals of the interface connector can be decreased, connection reliability can be improved, and EMI becomes more difficult to occur because the number of high-frequency current lines between the host computer and the liquid crystal display device decreases.

Figure 40:
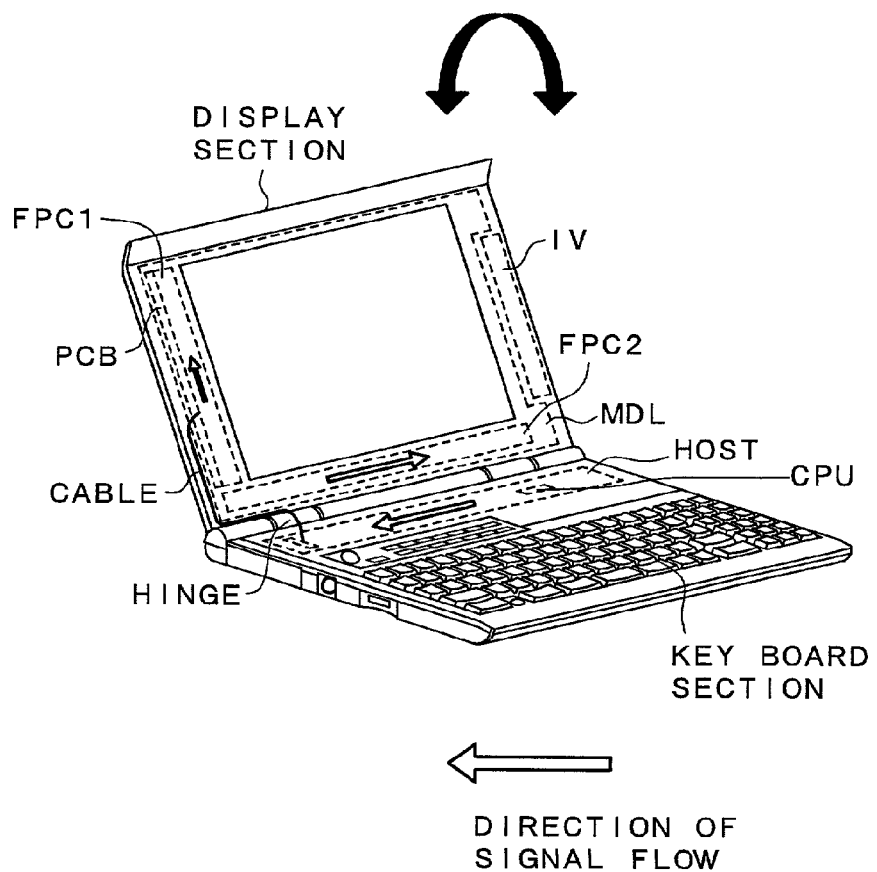
FIG. 40 is an explanatory view of a portable notebook type personal computer as an example of an information processing apparatus having a liquid crystal display device of the present invention mounted thereto.

FIG. 40 is an explanatory view of a portable notebook type personal computer as an example of an information processing unit to which the liquid crystal display device according to the present invention is adapted. Hinges interconnect a keyboard section and a display section in this notebook type personal computer. The keyboard section incorporates a CPU as a host computer, and the liquid crystal display device according to the present invention is mounted to the display section.

The liquid crystal display device mounted to the display section includes a liquid crystal panel PNL, a flexible printed substrate FPC1 on the gate side, a flexible printed substrate FPC2 on the drain side, an interface substrate PCB having a low voltage operating signal LVDS receiver mounted thereto, an inverter power supply IV for back-light, and so forth. Symbol LPC represents a lamp cable for supplying power to a fluorescent tube constituting a back-light assembly from the inverter power supply IV.

Figure 41:
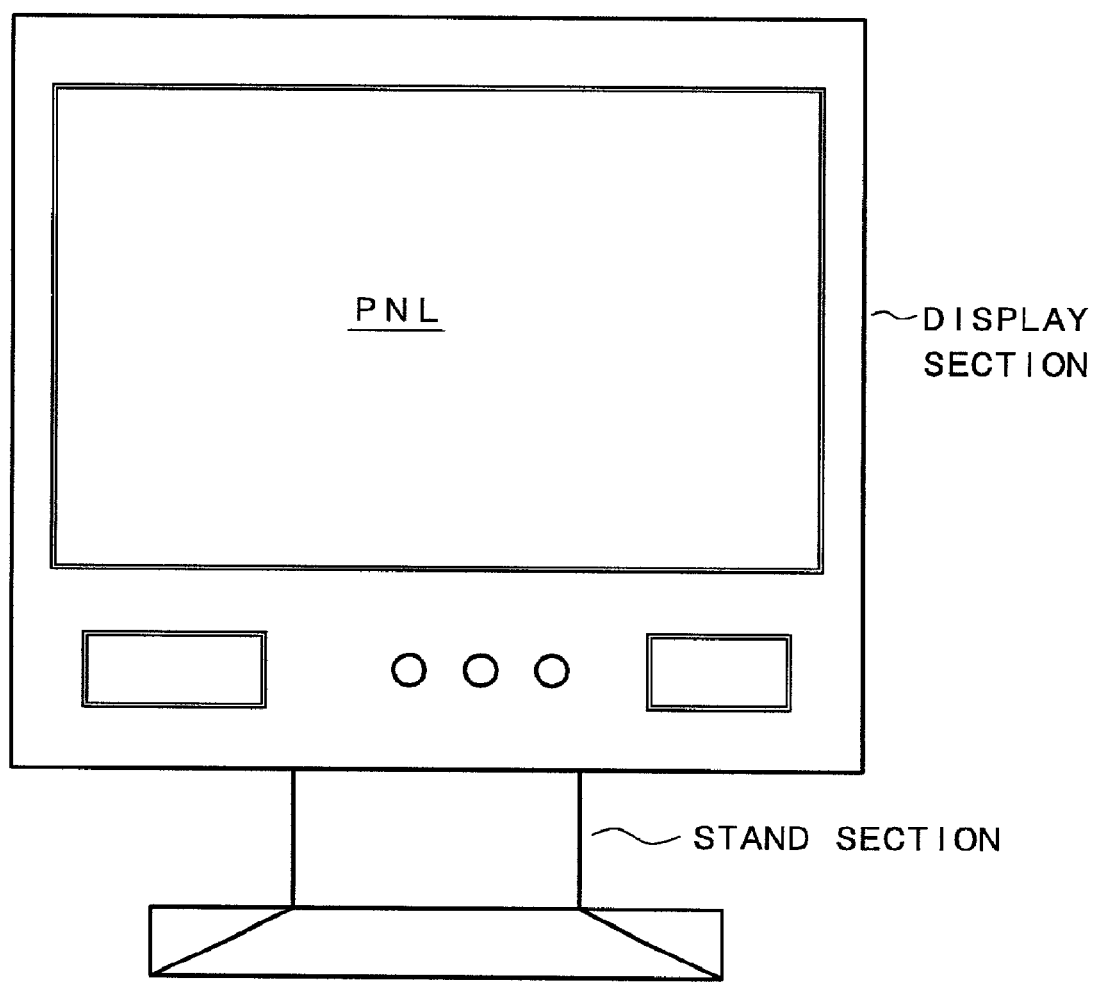
FIG. 41 is an appearance view showing an example of a desktop type monitor having a liquid crystal display device of the present invention mounted thereto.
Figure 42:
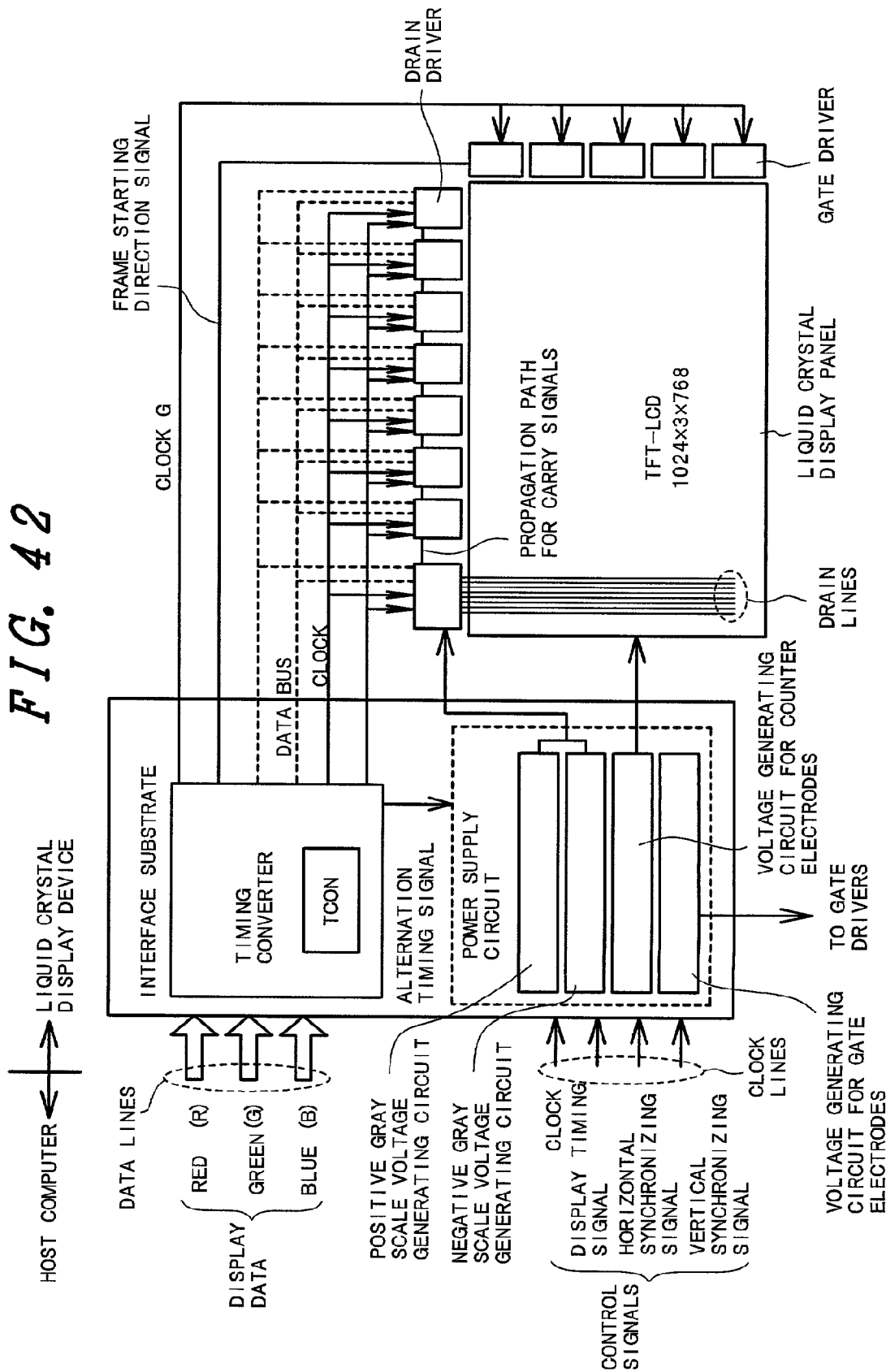
FIG. 42 is a block diagram useful for explaining a structural example of a driving circuit in an active matrix type liquid crystal display device.

FIG. 41 is an appearance view showing an example of a desk-top type monitor to which the liquid crystal display device according to the present invention is mounted. This monitor includes a display section to which the liquid crystal display device of this invention is mounted and a stand section for supporting the display section. The liquid crystal panel of the liquid crystal display device constitutes a screen in the display section.

The present invention can similarly applied to various display devices besides the information processing unit described with reference to FIGS. 40 and 41.

The present invention is not particularly limited to each of the foregoing embodiments, but can naturally be changed or modified in various ways without departing from the scope of the present invention.

As explained above and also in the paragraph "Summary of the Invention", the present invention directly mounts the drain drivers (inclusive of the gate drivers) to one of the substrates (generally, the TFT substrate) of the liquid crystal panel, and forms directly the lines serially connecting in series the drivers on this substrate, too. Therefore, the present invention can drastically simplify the FPC and can achieve a low production cost.

Since the flexible printed substrate on the drain driver side has a single layer on which only the power supply lines are formed, the present invention directly forms all the lines on the gate driver side on the lower substrate and substantially omits the flexible printed substrate on the gate side. Therefore, the present invention can simplify the overall construction of the liquid crystal display device and can achieve a more miniaturized liquid crystal display device. The present invention further provides great effects in reducing the number of necessary components and the assembling cost.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:
1. A liquid crystal display device comprising:
a liquid crystal panel assembled by bonding one of substrates having pixels each being arranged at an intersection between each of a plurality of drain lines and each of a plurality of gate lines intersecting said drain lines, to the other of said substrates having color filters;

a plurality of drain drivers directly mounted to a periphery of said one substrate in an extending direction of said gate lines, for applying gray scale voltage signals to said pixels so arranged as to correspond to predetermined groups of said plurality of drain lines on the basis of display data signals;

a plurality of gate drivers directly mounted to a periphery of said one substrate in an extending direction of said drain lines, for applying scanning voltage signals to said pixels arranged along said drain lines;

drain data lines directly formed on said one substrate, for serially transferring in series said display data signals, said gray scale voltage signals and various high-speed and low-speed clock signals inclusive of pixel clock signals between said drain drivers;

gate data lines directly formed directly on said one substrate, for serially transferring in series said scanning voltage signals and said scanning clock signals between said gate driver, and gate driver power supply lines; and a flexible printed substrate formed of a drain driver power supply line section and an interface wiring section, wherein said drain driver power supply line section has only drain driver power supply lines formed thereon along an outer periphery of said drain drivers on said one substrate, and said interface wiring section is arranged at an end of said drain driver power supply line section close to an area at which said gate drivers are arranged and has an extension of said drain driver power supply lines, drain data connecting lines connected to said drain data lines, gate data connecting lines connected to said gate data lines and gate driver power supply connecting lines connected to said gate driver power supply lines.

2. A liquid crystal display device comprising:

a liquid crystal panel assembled by bonding one of substrates having pixels each being arranged at an intersection between each of a plurality of drain lines and each of a plurality of gate lines intersecting said drain lines, to the other of said substrates having color filters;

a plurality of drain drivers directly mounted to a periphery of said one substrate in an extending direction of said gate lines, for applying gray scale voltage signals to said pixels so arranged as to correspond to predetermined groups of said plurality of drain lines on the basis of display data signals;

a plurality of gate drivers directly mounted to a periphery of said one substrate in an extending direction of said drain lines, for applying scanning voltage signals to said pixels arranged along said drain lines;

drain data lines directly formed on said one substrate, for serially transferring in series said display data signals, said gray scale voltage signals and various high-speed and low-speed clock signals inclusive of pixel clock signals between said drain drivers;

gate data lines directly formed directly on said one substrate, for serially transferring in series said scanning voltage signals and said scanning clock signals between said gate drivers, and gate driver power supply lines;

a flexible printed substrate having only drain driver power supply lines formed thereon along the outer periphery of said drain drivers of said one substrate;

drain data connecting lines connected to said drain data lines;

a drain driver power supply relay line formed on said substrate, and having one of the ends thereof connected to said drain diver power supply connecting lines; and a flexible printed substrate for interface wiring, provided at a side of said one substrate on which said drain drivers are arranged and near to an end thereof for mounting said gate drivers thereon, and having formed thereon drain driver power supply connecting lines connected to another end of said drain driver power supply relay line, gate data connecting lines connected to said gate data lines and a gate driver power supply connecting line connected to said gate driver power supply line.

3. A liquid crystal display device comprising:

a liquid crystal panel assembled by bonding one of substrates having pixels each being arranged at an intersection between each of a plurality of drain lines and each of a plurality of gate lines intersecting said drain lines, to the other of said substrates having color filters;

a plurality of drain drivers directly mounted to a periphery of said one substrate in an extending direction of said gate lines, for applying gray scale voltage signals to said pixels so arranged as to correspond to predetermined groups of said plurality of drain lines on the basis of display data signals;

a plurality of gate drivers directly mounted to a periphery of said one substrate in an extending direction of said drain lines, for applying scanning voltage signals to said pixels arranged along said drain lines;

drain data lines directly formed on said one substrate, for serially transferring in series said display data signals, said gray scale voltage signals and various high-speed and low-speed clock signals inclusive of pixel clock signals between said drain drivers;

gate data lines directly formed directly on said one substrate, for serially transferring in series said scanning voltage signals and said scanning clock signals between said gate drivers, and gate driver power supply lines;

a flexible printed substrate having only drain driver power supply lines formed thereon along an outer periphery of said drain drivers of said one substrate;

drain data connecting lines connected to said drain data lines;

a drain driver power supply relay line formed on said substrate, and having one of the ends thereof connected to said drain diver power supply connecting lines; and a flexible printed substrate for interface wiring, provided at a side of said substrates on which said gate drivers are arranged and near to an end thereof for mounting said gate drivers thereon, and having formed thereon drain driver power supply connecting lines connected to another end of said drain driver power supply relay line, gate data connecting lines connected to said gate data lines and a gate driver power supply connecting line connected to said gate driver power supply line.

4. A liquid crystal display device comprising:

a liquid crystal panel assembled by bonding one of substrates having pixels each being arranged at an intersection between each of a plurality of drain lines and each of a plurality of gate lines intersecting said drain lines, to the other of said substrates having color filters;

a plurality of drain drivers directly mounted to a periphery of said one substrate in an extending direction of said gate lines, for applying gray scale voltage signals to said pixels so arranged as to correspond to predetermined groups of said plurality of drain lines on the basis of display data signals;

a plurality of gate drivers directly mounted to a periphery of said one substrate in an extending direction of said drain lines, for applying scanning voltage signals to said pixels arranged along said drain lines;

drain data lines directly formed on said one substrate, for serially transferring in series said display data signals, said gray scale voltage signals and various high-speed and low-speed clock signals inclusive of pixel clock signals between said drain drivers;

gate data lines directly formed directly on said one substrate, for serially transferring in series said scanning voltage signals and said scanning clock signals between said gate drivers, and gate driver power supply lines;

a flexible printed substrate having only drain driver power supply lines formed thereon along an outer periphery of said drain drivers of said one substrate; and a flexible printed substrate for interface wiring, provided at a side of said gate driver of said one substrate, and having formed thereon drain data connecting lines connected to said drain data lines, gate data connecting lines connected to said gate data lines and a gate driver power supply connecting line connected to said gate driver power supply line.

* * * * *